United States Patent
Davids et al.

(10) Patent No.: US 11,296,240 B1
(45) Date of Patent: Apr. 5, 2022

(54) TUNNELING FULL-WAVE INFRARED RECTENNA

(71) Applicant: National Technology & Engineering Solutions of Sandia, LLC, Albuquerque, NM (US)

(72) Inventors: Paul Davids, Albuquerque, NM (US); Andrew Lea Starbuck, Albuquerque, NM (US); Robert L. Jarecki, Jr., Albuquerque, NM (US); David W. Peters, Albuqerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 158 days.

(21) Appl. No.: 16/702,732

(22) Filed: Dec. 4, 2019

Related U.S. Application Data

(60) Provisional application No. 62/777,265, filed on Dec. 10, 2018.

(51) Int. Cl.
*H01L 31/02* (2006.01)
*H01L 31/0224* (2006.01)
*H01L 31/068* (2012.01)

(52) U.S. Cl.
CPC .. *H01L 31/02021* (2013.01); *H01L 31/02008* (2013.01); *H01L 31/022425* (2013.01); *H01L 31/068* (2013.01)

(58) Field of Classification Search
CPC combination set(s) only.
See application file for complete search history.

(56) References Cited

U.S. PATENT DOCUMENTS

| | | | |
|---|---|---|---|
| 3,440,453 A * | 4/1969 | Kock | B60T 13/148 327/567 |
| 3,994,012 A * | 11/1976 | Warner, Jr. | H01L 31/047 136/246 |
| 6,369,759 B1 | 4/2002 | Epp et al. | |
| 7,091,918 B1 | 8/2006 | Bhansali et al. | |
| 7,329,871 B2 | 2/2008 | Fan et al. | |
| 7,352,468 B2 | 4/2008 | Tarsa | |

(Continued)

OTHER PUBLICATIONS

Alam, M. Z. et al., "Large optical nonlinearity of indium tin oxide in its epsilon-near-zero region," Science (2016) 352 (6287):795-797.

(Continued)

*Primary Examiner* — Telly D Green
(74) *Attorney, Agent, or Firm* — Martin I. Finston

(57) ABSTRACT

A rectenna is used for full-wave rectification of infrared radiation to produce electricity. In the rectenna, a metallic grating overlies a semiconductor body. A tunnel barrier is interposed between each grating element and the semiconductor body. Each of the grating elements overlies a bridge pair consisting of a region of $n^+$-doped semiconductor and a region of $p^+$-doped semiconductor, both of which are embedded in more lightly doped host semiconductor material. Each of the two regions that compose the bridge pair forms a rectifying tunnel junction through a tunnel barrier to at least one overlying grating element. Each of the two regions also forms a semiconductor junction with the host semiconductor material.

11 Claims, 16 Drawing Sheets

(56) References Cited

U.S. PATENT DOCUMENTS

| | | | |
|---|---|---|---|
| 7,501,636 B1 | 3/2009 | Son et al. | |
| 7,531,805 B1 | 5/2009 | Gregoire et al. | |
| 7,615,812 B1* | 11/2009 | Metzler | H01L 29/66075 257/288 |
| 7,649,496 B1* | 1/2010 | Silver | H01Q 1/38 343/700 MS |
| 8,115,683 B1 | 2/2012 | Stefanakos et al. | |
| 8,452,134 B1 | 5/2013 | Davids et al. | |
| 8,618,985 B2 | 12/2013 | Park et al. | |
| 8,897,609 B1 | 11/2014 | Davids et al. | |
| 9,437,629 B1 | 9/2016 | Davids et al. | |
| 2002/0117675 A1* | 8/2002 | Mascarenhas | H01L 33/305 257/87 |
| 2002/0125541 A1* | 9/2002 | Korec | H01L 29/872 257/471 |
| 2007/0052058 A1* | 3/2007 | Hirler | H01L 29/407 257/492 |
| 2010/0289721 A1* | 11/2010 | Silver | H01Q 1/248 343/904 |
| 2011/0156189 A1 | 6/2011 | Gravrand et al. | |
| 2013/0146117 A1* | 6/2013 | Brady | H02S 10/30 136/201 |
| 2013/0276861 A1 | 10/2013 | Cooke | |
| 2014/0001876 A1 | 1/2014 | Fujiwara et al. | |

OTHER PUBLICATIONS

Alù, A. et al., "Epsilon-near-zero metamaterials and electromagnetic sources: Tailoring the radiation phase pattern," Physical Review B (2007) 75:155410, 13 pages.

Bareiβ, M. et al., "Rectennas Revisited," IEEE Transactions on Nanotechnology (2013) 12(6):1144-1150.

Berreman, D. W., "Infrared Absorption at Longitudinal Optic Frequency in Cubic Crystal Films," Physical Review (1963) 130(6):2193-2198.

Briones, E. et al., "Seebeck nanoantennas for solar energy harvesting," Applied Physics Letters (2014) 105:093108, 4 pages.

Brown, W. C., "An Experimental Low Power Density Rectenna," IEEE MTT-S Digest (1991) 1:197-200.

Byrnes, S. J. et al., "Harvesting renewable energy from Earth's mid-infrared emissions," PNAS (2014) 111 (11):3927-3932.

Chan, W. R. et al., "Toward high-energy-density, high-efficiency, and moderate-temperature chip-scale thermophotovoltaics," PNAS (2013) 110(14):5309-5314.

Chen, P.-Y. et al., "Giant Photoresponsivity of Midinfrared Hyperbolic Metamaterials in the Photon-Assisted-Tunneling Regime," Physical Review Applied (2016) 5:041001, 7 pages.

Dagenais, M. et al., "Solar Spectrum Rectification Using Nano-Antennas and Tunneling Diodes," Optoelectronic Integrated Circuits XII, Eldada, L. A. et al. (eds.), Proc. of SPIE (2010) 7605:76050E, 12 pages.

Davids, P. S. et al., "Density matrix approach to photon-assisted tunneling in the transfer Hamiltonian formalism," Physical Review B (2018) 97:075411, 9 pages.

Davids, P. S. et al., "Infrared rectification in a nanoantenna-coupled metal-oxide-semiconductor tennel diode," Nature Nanotechnology (2015) 10:1033-1038.

Davids, P. et al., "Tunneling rectification in an infrared nanoantenna coupled MOS diode," Sandia National Laboratories, SAND2016-6591C, 26 pages.

Davids, P. S. et al., "Vacuum radiometry of an infrared nanoantenna-coupled tunnel diode," Sandia National Laboratory, SAND2017-3185C, 2 pages.

Davids, P. S. et al., "Vacuum radiometry of an infrared nanoantenna-coupled tunnel diode rectenna," Sandia National Laboratory, SAND2017-5458C, 2 pages.

Davids, P. S. et al., "Vacuum radiometry of an infrared nanoantenna-coupled tunnel diode rectenna," Sandia National Laboratory, SAND2017-0617C, 2 pages.

Davids, P. et al., "Vacuum radiometry of an infrared nanoantenna-coupled tunnel diode rectenna," Sandia National Laboratories, SAND2017-08538C, 25 pages.

Davids, P. S. et al., "Infrared Nanoantenna-Coupled Rectenna for Energy Harvesting," Sandia National Labratories, SAND2017-11872C, 1 page.

Davids, P. S. et al., "Power generation from thermal radiation: Photon-assisted tunneling in a metasurface-coupled rectifier," META 2018 Conference, Jun. 24—SAND2018-2120C, 2 pages.

Davids, P. S., "Power generation from thermal radiation: Photon-assisted tunneling in a metasurface-coupled rectifier," Sandia National Labs, SAND2018-6689C, 39 pages.

Davids, P. S., "Power generation from direct conversion of infrared radiation from a thermal source," Sandia National Labs, SAND2019-3859C, 29 pages.

Fiorino, A. et al., "Nanogap near-field thermophotovoltaics," Nature Nanotechnology (2018) 13:806-811.

Grover, S. et al., "Traveling-Wave Metal/Insulator/Metal Diodes for Improved Infrared Bandwidth and Efficiency of Antenna-Coupled Rectifiers," IEEE Transactions on Nanotechnology (2010) 9(6):716-722.

Hagerty, J. A. et al., "Recycling Ambient Microwave Energy With Broad-Band Rectenna Arrays," IEEE Transactions an Microwave Theory and Techniques (2004) 52(3):1014-1024.

Jordan, A. N. et al., "Powerful and efficient energy harvester with resonant-tunneling quantum dots," Physical Review (2013) 87:075312, 7 pages.

Kadlec, E. A. et al., "Photon-Phonon-Enhanced Infrared Rectifcation in a Two-Dimensional Nanoantenna-Coupled Tunnel Diode," Physical Review Applied (2016) 6:064019, 7 pages, SAND2017-1541J.

Kwok, S. P. et al., Metal-Oxide-Metal (M-O-M) Detector, Journal of Applied Physics (1971) 42(2):554-563.

Lim, M. et al., "Optimization of a near-field thermophotovoltaic system operating at low temperature and large vacuum gap," Journal of Quantitative Spectroscopy & Radiative Transfer (2018) 210:35-43.

Maraghechi, P. et al., "Enhanced rectifying response from metal-insulator-insulator-metal junctions," Applied Physics Letters (2011) 99:253503, 3 pages.

Maraghechi, P. et al., "Observation of resonant tunneling phenomenon in metal-insulator-insulator-insulator-metal electron tunnel devices," Applied Physics Letters (2012) 100:113503, 5 pages.

McSpadden, J. O. et al., "Theoretical and Experimental Investigation of a Rectenna Element for Microwave Power Transmission," IEEE Transactions on Microwave Theory and Techniques (1992) 40(12):2359-2366.

McSpadden, J. O. et al., "Design and Experiments of a High-Conversion-Efficiency 5.8-GHz Rectenna," IEEE Transactions on Microwave Theory and Techniques (1998) 46(12):2053-2060.

Sanchez, A. et al., "Generation of infrared radiation in a metal-to-metal point-contact diode at synthesized frequencies of incident fields: a high-speed broad-band light modulator," Appl. Phys. Lett. (1972) 21(5):240-243.

Sanchez, A. et al., "The MOM tunneling diode: Theoretical estimate of its performance at microwave and infrared frequencies," J. Appl. Phys. (1978) 49(10):5270-5277.

Santhanam, P. et al., "Thermal-to-electrical energy conversion by diodes under negative illumination," Physical Review B (2016) 93:161410(R), 5 pages.

Shank, J. et al., "Power Generation from a Radiative Thermal Source Using a Large-Area Infrared Rectenna," Physical Review Applied (2018) 9:054040, 8 pages.

Shank, J. et al., "Infrared Nanoantenna-Coupled Rectenna for Energy Harvesting," Sandia National Laboratories, SAND2017-11466C, 8 pages.

Shank, J. et al., "Power generation from a radiative thermal source using a large-area infrared rectenna," Sandia National Laboratories, SAND2018-02950J, 8 pages.

Shank, J. et al., "Infrared Nanoantenna-Coupled Rectenna for Energy Harvesting," Sandia National Laboratories, SAND2018-10342A, 1 page.

(56) References Cited

OTHER PUBLICATIONS

Shank, J. et al., "Infrared Nanoantenna-Coupled Rectenna for Energy Harvesting," Sandia National Laboratories, SAND2018-11771C, 10 pages.

Shank, J., "Infrafred Nanoantenna-Coupled Rectenna for Energy Harvesting," Sandia National Laboratories, SAND2019-2427C, 22 pages.

Sharma, A. et al., "A carbon nanotube optical rectenna," Nature Nanotechnology (2015) 10:1027-1032.

Sothmann, B. et al., "Thermoelectric energy harvesting with quantum dots," Nanotechnology (2015) 26:032001, 23 pages.

Suh, Y.-H. et al., "A High-Efficiency Dual-Frequency Rectenna for 2.45- and 5.8-GHz Wireless Power Transmission," IEEE Transactions on Microwave Theory and Techniques (2002) 50(7):1784-1789.

Tien, P. K. et al., "Multiphoton Process Observed in the Interaction of Microwave Fields with the Tunneling between Superconductor Films," Physical Review (1963) 129(2):647-651.

Vassant, S. et al., "Berreman mode and epsilon near zero mode," Optics Express (2012) 20(21):23971-23977.

Ward, D. R. et al., "Optical rectification and field enhancement in a plasmonic nanogap," Nature Nanotechnology (2010) 5:732-736.

Zhao, B. et al., "High-performance near-field thermophotovoltaics for waste heat recovery," Nano Energy (2017) 41:344-350.

\* cited by examiner

TUNNELING FULL-WAVE INFRARED RECTENNA

CROSS-REFERENCE TO RELATED APPLICATION

This application claims the benefit of provisional patent application Ser. No. 62/777,265, which was filed on Dec. 10, 2018 by Paul Davids et al. under the title, "Tunneling Full-Wave Infrared Rectenna," the entirety of which is hereby incorporated herein by reference.

ACKNOWLEDGEMENT OF GOVERNMENT SUPPORT

This invention was made with Government support under Contract No. DE-NA0003525 awarded by the United States Department of Energy/National Nuclear Security Administration. The Government has certain rights in the invention.

FIELD OF THE INVENTION

This invention relates to devices that use metamaterial structures and the like to convert electromagnetic energy to electrical output.

ART BACKGROUND

Techniques for the direct conversion and detection of electromagnetic energy in the microwave region of the electromagnetic spectrum are well established. High-speed nonlinear rectifying elements, such as Schottky diodes, are available and have demonstrated relatively high conversion efficiencies. Indeed, conversion efficiencies as high as 84% have been reported with direct rectification at 2.45 GHz.

Typical devices for direct conversion of microwave radiation use discrete diode elements and well-established antenna designs with impedance matching. It is not straightforward, however, to extend these established techniques into the infrared spectrum. One of the technical obstacles is that at infrared wavelengths, the known rectifying elements do not generally behave as lumped elements. Another of the obstacles is that carrier transport effects in semiconductor diodes are generally too slow to permit the direct conversion of infrared radiation to electrical energy.

One approach for overcoming these, and other, obstacles is to employ a device referred to as a rectenna. In a rectenna, a nanoantenna is integrated with a rectifying tunnel diode. The nanoantenna forms the upper terminal of the rectifying tunnel diode. The lower terminal of the rectifying tunnel diode is a thin layer of conducting material, which is separated from the nanoantenna by an intervening layer of insulator so that a tunnel junction is formed between the upper and lower terminals.

A portion of the infrared radiation incident on the rectenna couples into the insulator layer, where it is confined. The confined electromagnetic field, particularly the electric field component directed perpendicular to the tunnel junction (i.e., the transverse component), drives an enhanced tunnel current through the diode. Because the tunnel junction is a rectifying junction, the tunnel current is a half-wave DC current. A corresponding half-wave DC voltage drop can be measured across an external load resistance connected between the upper and lower terminals.

A rectenna as described above is disclosed in U.S. Pat. No. 9,437,629, which issued to Paul Davids et al. on Sep. 6, 2016 under the title, "Rectenna that Converts Infrared Radiation to Electrical Energy," and which is commonly owned herewith. The entirety of the abovesaid U.S. Pat. No. 9,437,629 is hereby incorporated herein by reference.

In a specific example described in U.S. Pat. No. 9,437,629, the nanoantenna is constituted by an aluminum grating with a period of 3 µm and a coverage ratio (i.e. the fraction of the grating covered by metal bars) of 60%. The bottom terminal of the rectenna is constituted by a heavily doped surface region of the silicon substrate, which is etched to create a pattern of long, parallel ridges that are matched to and underlie respective metal bars of the grating. To create the tunnel barrier, an insulative layer of silicon dioxide, 3.5 nm thick, is interposed between each metal bar and its underlying silicon ridge. The entire structure is overclad with silicon dioxide.

Electromagnetic modeling of a rectenna similar to that described above (but with a 5-nm insulator layer) predicted a sixteen-fold enhancement of the transverse electric field within the gap defined by the insulator layer.

Although useful, the rectenna of U.S. Pat. No. 9,437,629 has limited efficiency for conversion of radiation to electricity because it performs only half-wave rectification. What has been lacking, until now, is an extension of this approach that can achieve greater efficiencies through full-wave rectification.

SUMMARY OF THE INVENTION

We have developed a rectenna that can convert infrared radiation to electrical energy with full-wave rectification. Surprisingly, an implementation of our new rectenna design outperformed the rectenna of U.S. Pat. No. 9,437,629 by a factor of more than one thousand in a comparative experiment. More specifically, we measured electric power generated (per unit area) in response to thermal radiation at an equivalent source temperature of 400° C. at a load resistance optimized for maximum power generation. A prototype of the half-wave device as described in U.S. Pat. No. 9,437,629 generated about 1 nW/cm$^2$. By contrast, a prototype of our new full-wave device generated more than 1 µW/cm$^2$, and another prototype, operating at peak power density with optimized load resistance, generated 61 µW/cm$^2$.

Like the rectenna of U.S. Pat. No. 9,437,629, our new rectenna includes a metal grating overlying a highly doped surface portion of a semiconductor substrate, with an insulative tunnel barrier interposed between the grating metal and the underlying semiconductor surface.

However, the surface portion of our new rectenna is patterned with alternating p-type and n-type bands of highly doped semiconductor material, which we refer to respectively as p$^+$ bands or regions and n$^+$ bands or regions. Each n$^+$ band is paired with an adjacent p$^+$ band. We refer to each of these pairs of bands of doped semiconductor as a "bridge pair" because it is bridged by one or more grating elements, as will be explained below.

When we say that a region of a semiconductor body is highly doped, or when we say that it is doped n$^+$ or p$^+$, what we mean is that the doping concentration is in the range from $1 \times 10^{18}$ cm$^{-3}$ up to the limit of solid solubility.

The grating may be one-dimensional, in which case it consists of a plurality of parallel bars, or it may be two-dimensional, in which case it consists of an array of patch antennas arranged in rows and columns. We refer collectively to grating bars and patch antennas as "grating elements".

In our new rectenna, a bar of a one-dimensional grating, or a column of patch antennas of a two-dimensional grating, overlies each of the bridge pairs so that each grating element forms two rectifying tunnel junctions through the insulative tunnel barrier. One of these junctions is formed with the p$^+$ band of the bridge pair, and the other is formed with the n$^+$ band of the bridge pair.

It will be evident to those skilled in the art that unless measures are taken to prevent it, p-n junctions may form between p$^+$ bands and their neighboring n$^+$ bands, both within bridge pairs and between neighboring bridge pairs. However, such junctions are not essential to the operation of the rectenna, and in preferred embodiments they are absent or very weak.

However, each of the p$^+$ bands of a bridge pair form a rectifying semiconductor junction with the adjacent, less highly doped host semiconductor material, and each of the n$^+$ bands of a bridge pair likewise make a rectifying semiconductor junction with the adjacent, less highly doped host semiconductor material. These two types of rectifying junctions (referred to respectively as "p$^+$-host" and "n$^+$-host" junctions), together with the rectifying tunnel junctions described above, are important for the operation of the rectenna.

Specifically, the four rectifying junctions at each grating element cooperate in a manner that can emulate the operation of a full-wave bridge rectifier under irradiation by infrared light of suitable wavelength content. The infrared irradiation excites a confined optical-frequency electric field within the tunnel barrier. This electric field can drive a tunnel current through a load, e.g. a resistor, connected between the p$^+$ and n$^+$ bands. In such an arrangement, the four rectifying junctions respond in such a way that a full-wave rectified current is driven through the load.

Accordingly, a rectenna according to an embodiment of the invention comprises a semiconductor body, a metallic grating that overlies the semiconductor body and includes a plurality of grating elements, and a tunnel barrier, comprising tunnel barrier material, interposed between each grating element and the semiconductor body. In the rectenna, each of the grating elements overlies a bridge pair consisting of a region of n$^+$-doped semiconductor and a region of p$^+$-doped semiconductor, both of which are embedded in more lightly doped host semiconductor material. Each of the two regions that constitute the bridge pair forms a rectifying tunnel junction through a tunnel barrier to at least one overlying grating element. Each of the two regions also forms a semiconductor junction with the host semiconductor material.

In embodiments, the semiconductor body comprises a bulk silicon substrate and an epitaxial silicon layer grown on the bulk silicon substrate.

In embodiments, each grating element is an elongated metal bar that overlies a respective bridge pair. In other embodiments, each grating element is a discrete patch antenna included in a linear array of discrete patch antennas that overlies a respective bridge pair.

In embodiments, an isolation trench separates each region of n$^+$-doped semiconductor from its adjacent region or regions of p$^+$-doped semiconductor.

In embodiments, the substrate comprises silicon and the tunnel barrier material is composed of thermally grown silicon dioxide.

Alternate materials for the tunnel barrier include silicon nitride, silicon oxynitride, hafnia, and alumina.

In embodiments, overetches are interposed between the grating elements, wherein each overetch is defined by an absence of tunnel barrier material and a thinning of the semiconductor body, and wherein a reflective diffraction grating is defined by the grating elements and the trenches.

In embodiments, the reflective diffraction grating is conformed with a reflective diffraction minimum that falls within the spectral range from 5 μm to 20 μm.

In embodiments, the reflective diffraction grating is conformed with a reflective diffraction minimum at a wavelength that substantially coincides with an epsilon-near-zero (ENZ) point of the tunnel barrier material.

BRIEF DESCRIPTION OF THE DRAWINGS

In FIG. 12, separate plots are provided for barrier heights from 1.0 eV to 1.75 eV in increments of 0.25 eV at a constant barrier thickness of 1.5 nm. In FIG. 13, separate plots are provided for barrier thicknesses of 1 nm, 1.3 nm, 1.5 nm, 2.0 nm, and 2.5 nm at a constant barrier height of 1.5 eV.

DETAILED DESCRIPTION

Figure 1:
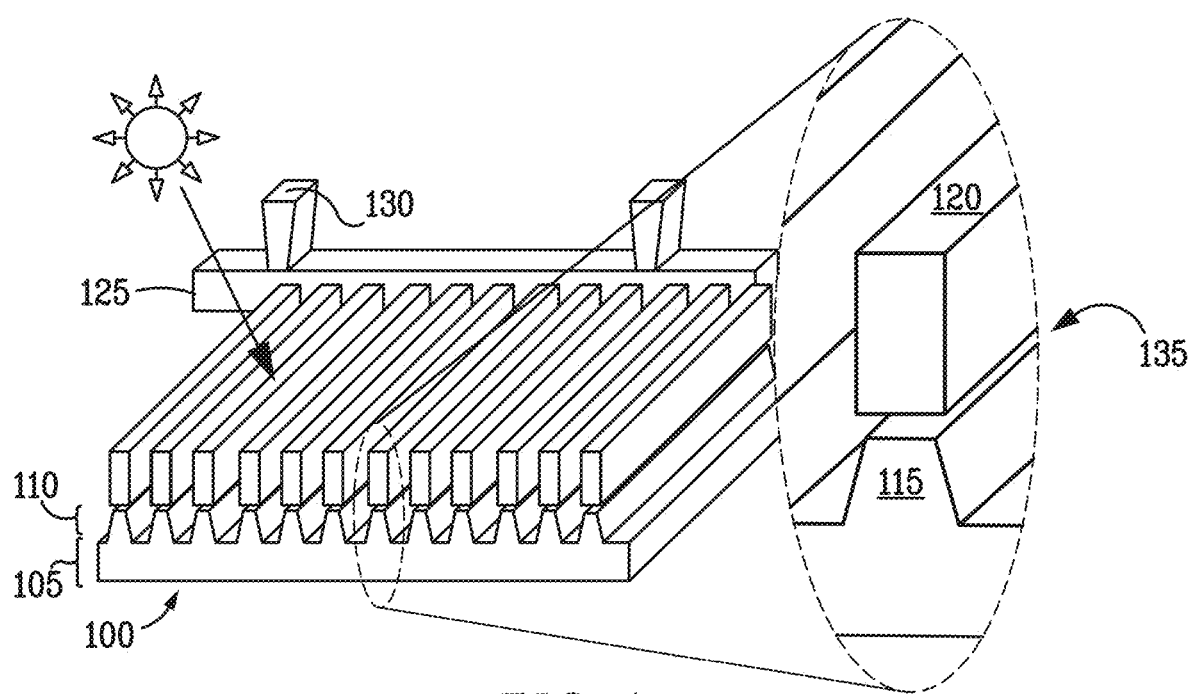
FIG. 1 is a perspective view of a rectenna of a kind described in the prior art, incorporating a 1D grating structure.

FIG. 1 is a perspective view of a rectenna of the kind described in U.S. Pat. No. 9,437,629, cited above. As seen in the figure, a substrate 100 includes a lower bulk portion 105 and an upper surface portion 110 that is conformed as a plurality of ridges 115 that are separated from each other by isolation trenches. Each ridge 115 is overlain by a metal nanoantenna element 120. Each of the metal nanoantenna elements is a bar of a one-dimensional grating.

For electrical connection, the nanoantenna elements all join a bus bar 125, which is contacted by metal vias 130. Each of the metal nanoantenna elements 120 is separated from its underlying ridge 115 by a tunnel barrier 135. The tunnel barriers are constituted by an insulative material which, for simplicity of presentation, is not shown explicitly in the figure. The tunnel barriers may be parts of a single continuous film of tunnel barrier material, or in other implementations they may be segregated into discrete patches of material.

Figure 2:
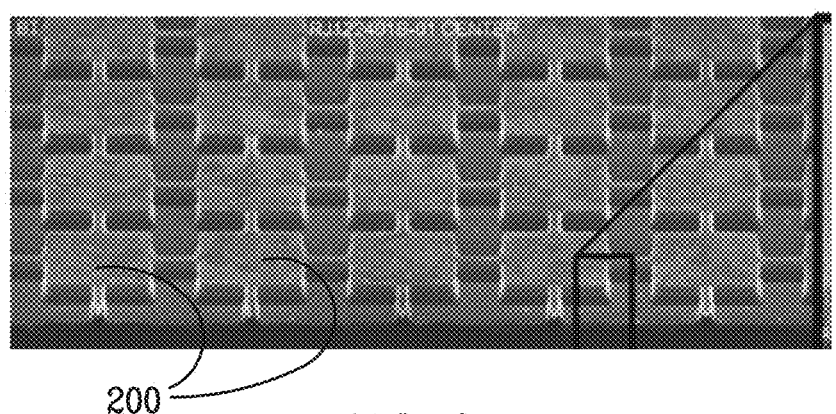
FIG. 2 is a perspective view of a 2D grating structure, known in the prior art, that is useful in designs for rectennas.

FIG. 2 is a perspective view of an alternative grating structure used in implementations of the rectenna described in U.S. Pat. No. 9,437,629. The grating structure of FIG. 2 is a two-dimensional grating constituted by a plurality of patch antennas 200, each of which is configured as a discrete metal square. As seen in the figure, the respective patch antennas are arranged in a 2D lattice of rows and columns. In the implementation that is illustrated, the lattice is interconnected by metal arms that connect each patch antenna to its neighbors. Such interconnection is not essential, however; it can be omitted in other implementations. It should also be noted in this regard that the square conformation for the patch antennas is only a non-limiting example. Various other shapes, such as rings and crosses, are known in the field of infrared nanoantennas and may be useful in the present context.

Figure 3:
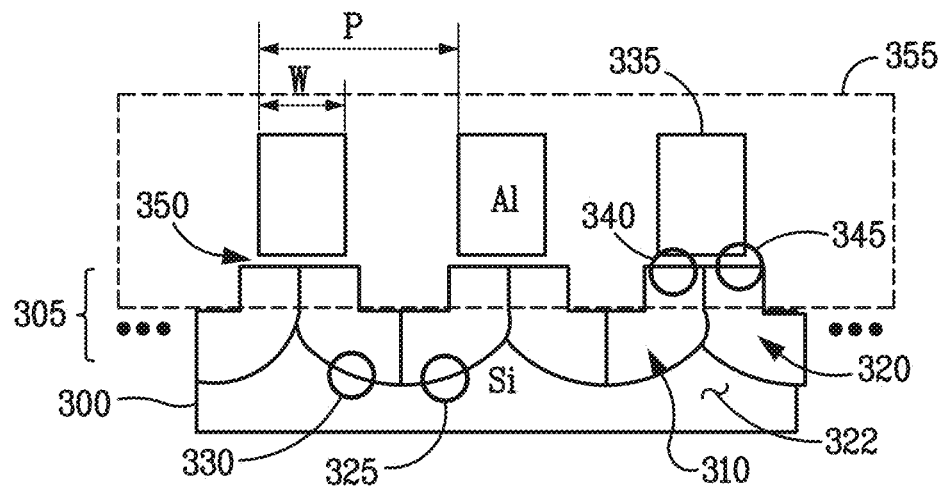
FIG. 3 is a schematic cross-sectional elevational view of a rectenna of the present invention in an illustrative example that uses a one-dimensional grating and that includes isolation trenches between the grating elements.

Turning now to the present invention, we refer first to FIG. 3. FIG. 3 is a schematic cross-sectional elevational view of a rectenna of the present invention in an illustrative example that uses a one-dimensional grating and that includes isolation trenches between the grating elements. As explained above, one of the features of the present invention is that beneath each metal nanoantenna element, the underlying substrate includes a bridge pair consisting of a region 310, e.g. a strip, of $n^+$ semiconductor material and a neighboring region 320, e.g. a strip, of $p^+$ semiconductor material. Although we refer to our new device as a "rectenna", it will be understood that in view of the importance of these bridge pairs in the functioning of the device, it is more specifically characterized as a "a grating-coupled bipolar tunnel diode" device.

As seen in the figure, the substrate includes an underlying bulk portion 300 and a surface portion 305 that has been doped to form the $n^+$ and $p^+$ regions.

As seen in the figure, the $n^+$ and $p^+$ regions are embedded in underlying host semiconductor material 322, which is more lightly doped than the $n^+$ and $p^+$ regions. In the example shown, the n-type and p-type doping is seen to extend sideways below the isolation trenches and partway into the underlying bulk portion of the substrate. It is not believed critical for the doped portions to extend into the bulk substrate and beneath the isolation trenches as shown. The $n^+$ and $p^+$ regions form respective rectifying semiconductor-semiconductor junction 325, 330 with the host semiconductor material. Methods for forming these junctions will be described below.

With further reference to FIG. 3, a grating element 335 overlies each of the bridge pairs. Importantly, each grating element overlies both the $n^+$ strip and the $p^+$ strip so as to form two respective rectifying tunnel junctions 340, 345 across the intervening tunnel barrier 350. As shown in the figure, the isolation trenches are filled, and the entire structure is advantageously overcoated with a protective layer 355 of dielectric material such as silicon dioxide.

Figure 4:
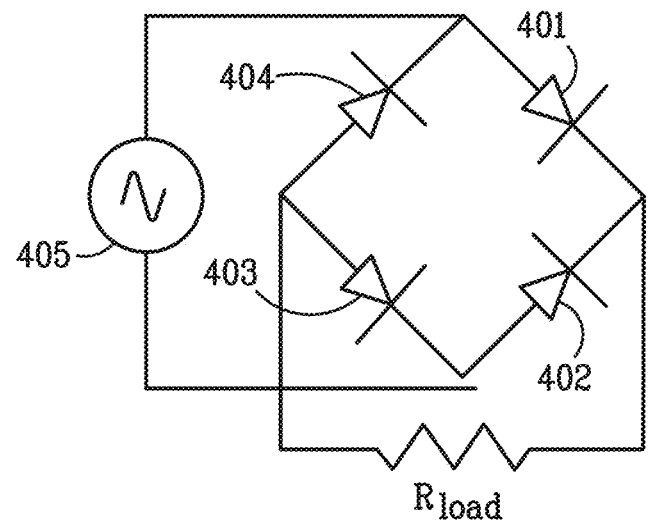
FIG. 4 is a schematic circuit diagram of a full-wave bridge rectifier. This figure is included as a pedagogical aid for explaining the principal of full-wave rectification.

As pointed out above, the rectifying junctions 325, 330, 340, and 345 can emulate a full-wave bridge rectifier. For purely pedagogical purposes, we have presented in FIG. 4 a schematic circuit diagram of a full-wave bridge rectifier constituted by diodes 401, 402, 403, and 404 connected in a bridge. An AC voltage source 405 and a load resistance $R_{load}$ are connected across the bridge.

According to well-known principles of circuit operation, the applied voltage, when it is positive, will drive a current from the upper terminal of source 405, through diode 401, from right to left through the load, and then through diode 403 to the lower terminal of source 405. When the applied voltage is negative, it will drive a current from the lower terminal of source 405, through diode 402, again from right to left through the load, and then through diode 404 to the upper terminal of source 405. Accordingly, current will flow through the load in the same direction in both the positive and negative phases of the voltage cycle. This is an illustration of full-wave rectification.

Figure 5:
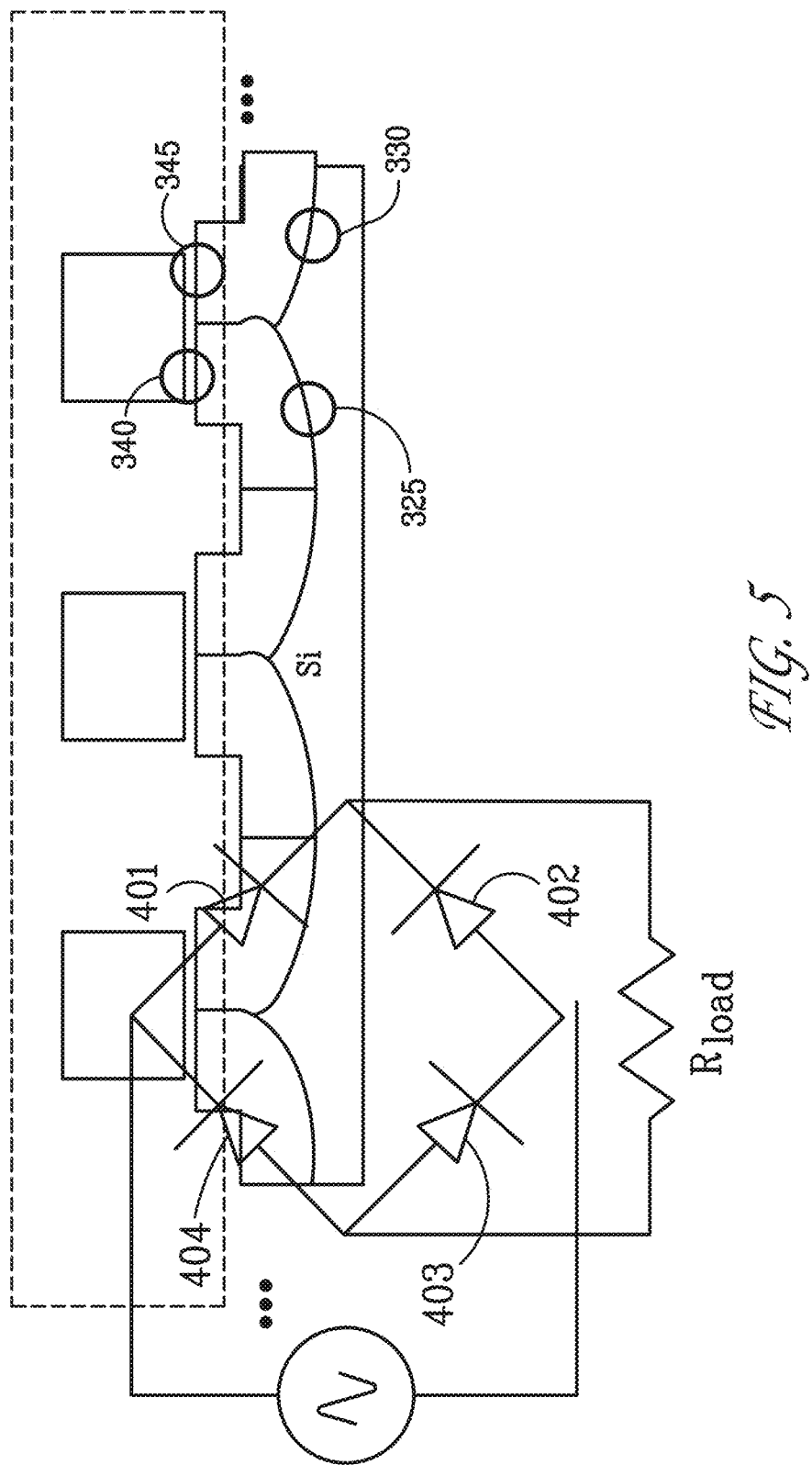
FIG. 5 is a reproduction of FIG. 3, on which is superposed a schematic view of the full-wave bridge rectifier of FIG. 4 in order to illustrate an analogy between the devices of the respective figures.

FIG. 5 is a copy of FIG. 3, on which we have superposed a schematic of the full-wave bridge rectifier in order to illustrate the analogy between the rectifying junctions 325, 330, 340, and 345 and the diodes 401-404. On inspection of the figure, it will be seen that the diodes 401-404 correspond respectively to junctions 345, 330, 325, and 340.

In operation, incident radiation from a source, for example thermal radiation from a hot body, produces an oscillating, optical frequency electric field within the tunnel barrier. This field drives the photocurrent that is rectified as explained above so that it can be applied for a useful purpose.

At least for wavelengths near the grating resonance, the transverse electric field component within the tunnel barrier has opposite polarities at the $n^+$ side and the $p^+$ side, respectively. These polarities reverse in each half-cycle of the field oscillation.

In one half-cycle, the polarities are directed so as to drive tunneling of electrons from the $n^+$ semiconductor to the metal and from the metal to the $p^+$ semiconductor, so that both of the rectifying tunnel junctions are forward biased. In the next half-cycle, the field profile is inverted, both of the tunnel junctions are reversed biased, and a smaller photocurrent is obtained.

As explained in more detail below, we believe that a photocurrent is generated in our rectenna device by the confined transverse electromagnetic field within the tunnel barrier, and that this occurs through photon-assisted tunneling. In this regard, the "transverse" field is the field component in the epitaxial growth direction, i.e., the direction perpendicular to the substrate.

Although we do not wish to be limited by any particular mechanism, we have found helpful insights by modeling the tunneling as a multi-step process: A photon is absorbed in an occupied state near the Fermi energy of the metal. This is followed by field enhanced tunneling into an unoccupied state of the silicon, leading to a small dc photocurrent. A similar time-reversed process occurs in the semiconductor, resulting in a backflow current into the metal. The forward currents are greater than the reverse currents because of the difference in electronic effective mass between the metal and the semiconductor. The difference between the two currents results in a net forward dc current.

The spatial profile of the confined optical field within the tunnel barrier cooperates with the photon-assisted tunneling to produce the photocurrent. For example, an interdigitated bipolar p-n junction array can be installed under the tunneling gate electrode and conformed so that one-half the spatial period of the optical field spans one bridge pair, i.e., one p-type region, one n-type region, and the junction between them.

Figure 6:
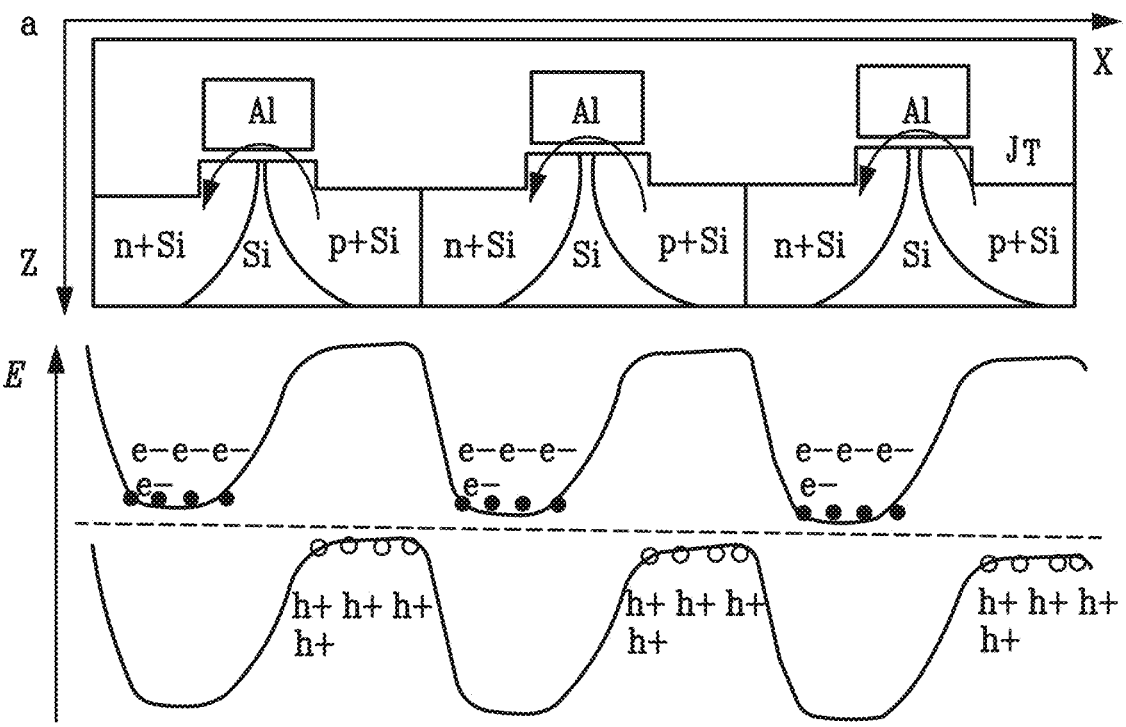
FIG. 6 is a cartoon drawing that shows, in schematic fashion, several periods of a bipolar grating-coupled tunnel diode designed according to principles described here. The lower part of the figure includes an idealized graph of the underlying band structure, in which alternating energy wells for electrons and holes can be seen. Also indicated in the figure is an instantaneous particle current $J_T$.

Under those conditions, the optical field can act as a charge pump. That is, in half of each oscillation, the field drives electrons from the p-type region to the n-type region. FIG. 6 is a cartoon drawing that shows the multiple periods of such a bipolar grating-coupled tunnel diode in schematic fashion. The lower part of the figure includes an idealized graph of the underlying band structure, in which alternating energy wells for electrons and holes can be seen.

As shown in the figure, an instantaneous particle current, JT arises from photon-assisted tunneling and leads to charge separation into the electron and hole wells.

At any given instant, the enhanced transverse field at the grating resonance corresponds to is a spatially varying voltage profile across the width of the grating metal. At maximum current, the metal-$n^+$ and metal-$p^+$ tunnel diodes behave as forward biased tunnel junctions. After a half-cycle of the optical field, the two tunnel junctions are reverse biased, and there is a small backflow current.

Figure 7:
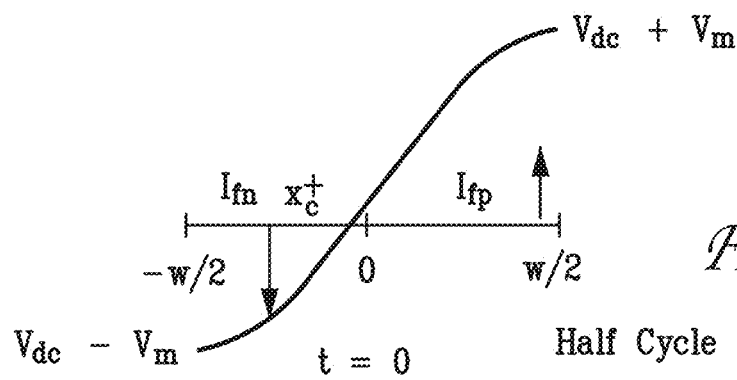
FIGS. 7 and 8 are graphs respectively illustrating the instantaneous voltage profile in a numerically modeled device at the beginning of an oscillation of the optical field (i.e., at t=0) and at the end of the first half-cycle (i.e., at t=T/2, where T is the period of the oscillation).
Figure 8:
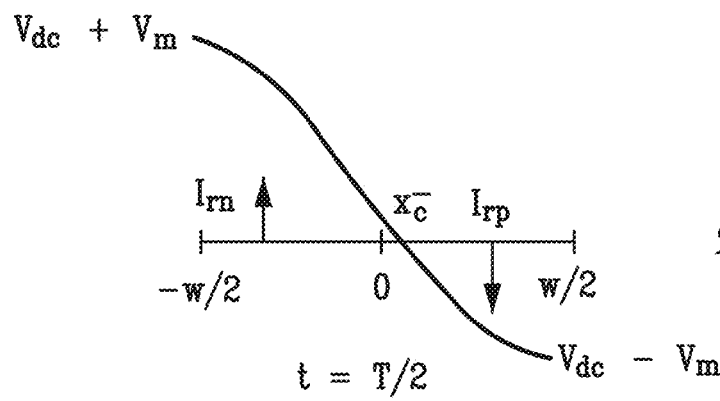

FIGS. 7 and 8 are graphs respectively illustrating the instantaneous voltage profile in the device at the beginning of an oscillation of the optical field (i.e., at t=0) and at the end of the first half-cycle (i.e., at t=T/2, where T is the period of the oscillation). These graphs are the result of numerical modeling of an ideal device in which a symmetric p-n junction is buried under the metal gate.

With reference to the figures, $V_m$ is the ac voltage amplitude, and $V_{dc}$ is a small dc bias added to account for self-bias of the device. $I_{fn}$ and $I_{fp}$ are, respectively, the metal-to-$n^+$ and $p^+$-to-metal tunnel currents under forward bias. $I_{rn}$ and $I_{rp}$ are, respectively, the metal-to-$n^+$ and $p^+$-to-metal tunnel currents under reverse bias. The width of the metal gate is w. Between t=0 and t=T/2, it will be seen in the figures that the voltage node shifts from a negative position $x_c^+$ to a positive position $x_c^-$. Arrows in the figures indicate the magnitudes and directions of the respective forward currents $I_{fn}$ and $I_{fp}$, and of the respective backflow currents $I_{rn}$ and $I_{rp}$.

Figure 9:
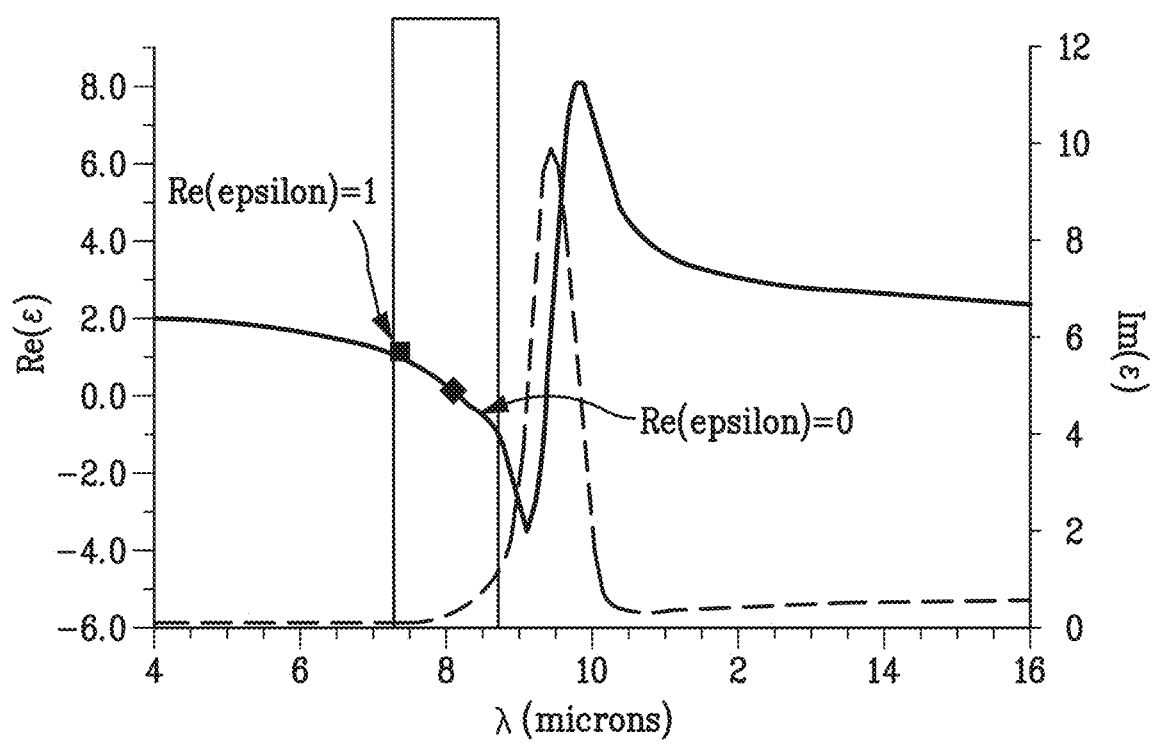
FIG. 9 is a plot of the real part (solid curve) and imaginary part (dashed curve) of the dielectric function $\varepsilon$ of silicon oxide as functions of wavelength.

As is well known in the field of optical materials, there are some insulative materials that exhibit a feature known as the epsilon-near-zero point, or "ENZ point", in the infrared spectrum. Herein, we will refer to materials of that kind as "ENZ materials". One example of an ENZ material is silicon dioxide. Illustratively, FIG. 9 is a plot of the real part (solid curve) and imaginary part (dashed curve) of the dielectric function $\varepsilon$ of silicon oxide, versus wavelength. It will be seen on inspection of the figure that the real part, Re($\varepsilon$), crosses from positive to negative values as the wavelength increases through the neighborhood of 8 μm.

When a film of ENZ material is impinged by a beam of infrared radiation, there tends to be a strong enhancement in the transverse component of the optical-frequency electric field within the material at wavelengths near the ENZ point. When this occurs, the optical field is said to be "captured" by the ENZ material. (When we refer to the transverse component in this regard, what we mean is the component perpendicular to the film, i.e., the component along the z-axis.)

The electrical response of the rectenna to impinging radiation is very sensitive to the electric field strength within the tunnel barrier. This is true because the tunnel current across each of the respective junctions 340, 345 behaves, qualitatively, like a diode current modified by a tunneling probability. The diode current and the tunneling probability are each highly sensitive to the captured field (although for different reasons). Their combination is even more sensitive.

Hence, the performance of the rectenna can be expected to exhibit enhancement near the ENZ point. Specific materials can be chosen for the tunnel barrier that have ENZ points in the desired portions of the infrared spectrum.

Figure 10:
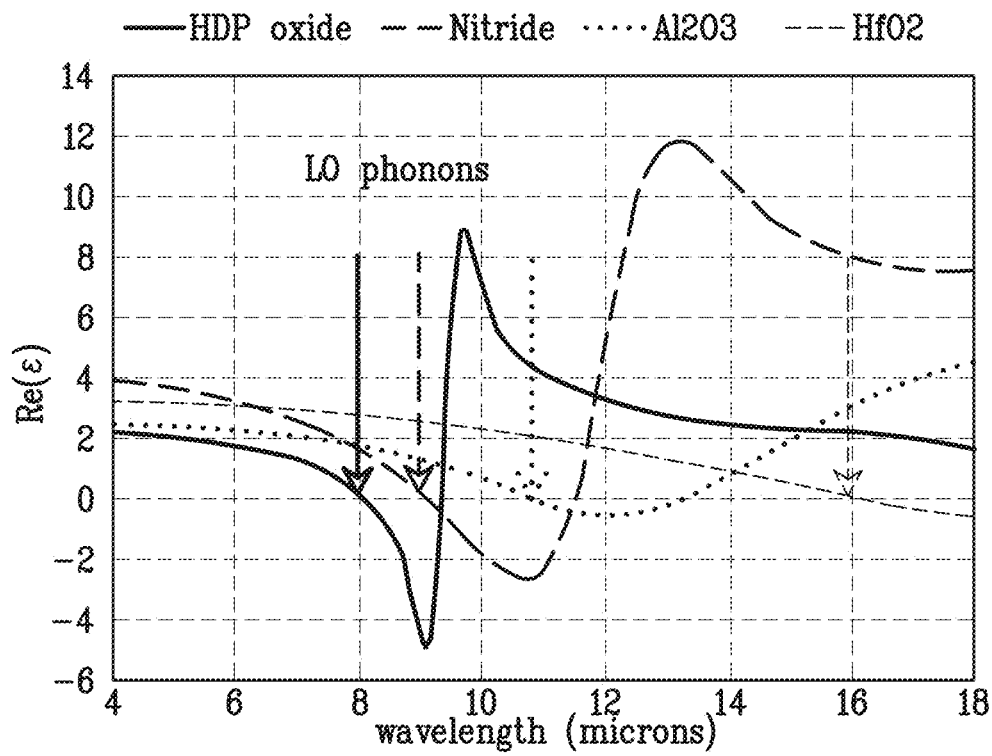
FIGS. 10 and 11 are respective plots of Re(ε) and Im(ε), i.e., the real and imaginary parts of the dielectric function, for four common ENZ materials: HDP silicon oxide, silicon nitride, aluminum oxide, and hafnia.
Figure 11:
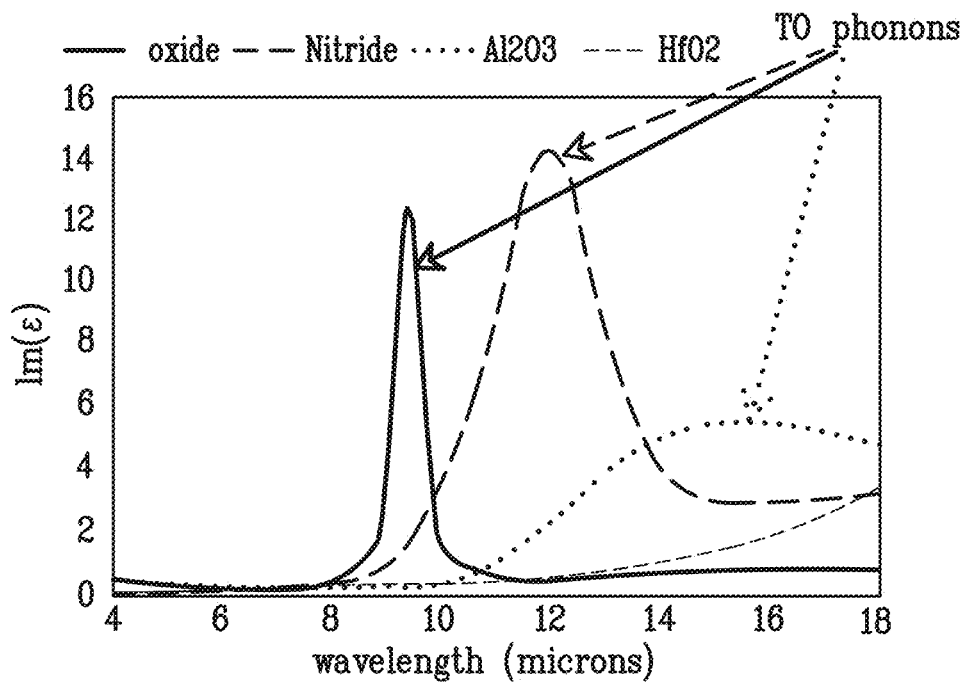

For example, FIGS. 10 and 11 are respective plots of Re($\varepsilon$) and Im($\varepsilon$) for four common ENZ materials: HDP silicon oxide, silicon nitride, aluminum oxide, and hafnia. It will be seen on inspection of the figures that for this group of materials, the ENZ points range over the infrared spectrum from about 8 μm to about 16 μm. It will also be evident from the figures that the ENZ points fall near LO phonon resonances of the materials.

The grating is designed so that at or near the ENZ point, the relative efficiency for reflection into the zeroth diffraction order is minimized. Herein, we refer to the wavelength of such a minimum as the resonant wavelength of the grating.

Techniques for placing the grating resonance at a desired wavelength are well-known and need not be described here in detail. Basically, the design parameters for the grating are varied in a numerical simulation until the desired response is obtained.

We will now briefly describe a result from the theory of binary phase gratings. This is a highly simplified example presented here purely as a pedagogical aid to enhance an intuitive understanding of how our grating can be engineered.

The zero-order diffraction efficiency $DE_0$ of a simple binary phase grating having alternating positive and negative pulses is $$DE_0 = \left(\frac{b}{h}\right)^2 \cdot 4\cos^2(m\pi),$$

where b and h are respectively the pulse width and period of the grating, and the (wavelength-dependent) phase difference between the positive and negative grating pulses is m times $2\pi$ radians. Hence, the zero-order reflection is suppressed whenever m is an odd multiple of ½.

Similar principles can be applied to our grating, but the combined dimensions and optical properties of various materials must be considered.

The grating resonance is intended to overlap, or nearly overlap, the ENZ response of the tunnel-barrier material. This facilitates the coupling of the optical-frequency electric field into the subwavelength gap defined by the tunnel barrier. The resulting resonance may be thought of as a confined surface plasmon polariton on the metal surface of the grating. It is that excitation that accounts for the coupling into the gap of subwavelength thickness.

A grating having any desired resonant wavelength over at least the near-infrared and mid-infrared spectra can readily be designed according to procedures that are well known in the art, as noted above.

Accordingly, a currently preferred embodiment of the invention has a tunnel barrier with an ENZ point that substantially coincides with a resonant wavelength of the grating. The coincidence is considered to be "substantial" in this regard if it is close enough to account, qualitatively, for the performance of the device.

The optical confinement due to plasmonic coupling to the ENZ resonance is verifiable through, e.g., its angular dependence. In fact, both the angle of incidence and the polarization of the input field tend to modulate the field enhancement within the gap. This is reported, for example, in Paul S. Davids et al., "Infrared rectification in a nanoantenna-coupled metal-oxide-semiconductor tunnel diode," *Nature Nanotechnology Letters* 10 (December 2015, published online 28 Sep. 2015) 1033-1038, hereinafter cited as "Davids (2015)", which is hereby incorporated herein by reference in entirety. As reported in Davids (2015), we observed variations in the photocurrent response to light at the resonant frequency when we changed the polarization between TE and TM. In a further modeling study, we found an upper limit of about 18° for the angular range of the enhanced field coupling. That study was reported in Emil A. Kadlec et al., "Photon-Phonon-Enhanced Infrared Rectification in a Two-Dimensional Nanoantenna-Coupled Tunnel Diode," *Phys. Rev. Appl.* 6 (2016) 064019-1 to 064019-7, hereinafter cited as "Kadlec (2016)", the entirety of which is hereby incorporated herein by reference.

The photocurrent that is generated in our device is a consequence of photon-assisted tunneling. For rectennas of the kind described in U.S. Pat. No. 9,437,629, we made theoretical predictions of photon-assisted tunneling based on the transfer Hamiltonian approach that was first formulated by J. Bardeen as a semiempirical approach to calculate tunneling currents between a superconductor and a normal metal but has since been applied more generally. Our results are reported in P. S. Davids and J. Shank, "Density matrix approach to photon-assisted tunneling in the transfer Hamiltonian formalism," *Phys. Rev. B* 97 (2018) 075411-1ff (nine pages), cited herein as "Davids (2018)".

Although we do not wish to be limited by mechanism, we will now summarize certain results reported in Davids (2018) as a pedagogical aid for a better understanding of the physical processes that are believed to contribute to the operation of our rectenna.

In Davids (2018), we derived an expression, in a first-order approximation, for the single-photon tunneling current J through a uniform barrier of height V and thickness $t_{ox}$ from a left half-space to a right half-space in the presence of a uniform, transversely polarized, frequency-dependent electric field $E(\omega)$ within the barrier. The electric field is from an incoherent black-body source at temperature T, having a small and finite bandwidth. The expression for the single-photon tunneling current J is:

$$J = \frac{4\pi e m_e}{\hbar^3 \beta^2}\left(\frac{m_r m_l}{m_{ox}^2}\right)\int_0^\infty \frac{d\omega}{2\pi}\left(\frac{et_{ox}}{\hbar\omega}\right)|E(\omega)|^2 \mathcal{T}(\omega).$$

In the above expression, the electronic charge is e, and the effective electronic mass in the barrier, the left half-space, and the right half space is, respectively, $m_{ox}$, $m_l$, and $m_r$. The term $\beta$ is defined by $\beta = 1/kT$, where k is Boltzmann's constant. The term $\mathcal{T}(\omega)$ is a quantity that we refer to as the "transmittance"; its value is given by:

$$\mathcal{T}(\omega) = \beta\int dE_l t(E_l, E_l + \hbar\omega)\ln\left[\frac{1 + \exp(-\beta E_l)}{1 + \exp[-\beta(E_l + \hbar\omega)]}\right] + \beta\int dE_l t(E_l, E_l - \hbar\omega)\ln\left[\frac{1 + \exp(-\beta E_l)}{1 + \exp[-\beta(E_l - \hbar\omega)]}\right],$$

and where the barrier transmittance $t(E_l, E_r)$ is defined in terms of the respective electric fields $E_l$, $E_r$ in the left and right half spaces by:

$$t(E_l, E_l) = e^{-(k+q)t_{ox}}\sinh^2\left(\frac{(k-q)t_{ox}}{2}\right),$$

where k and q are, respectively, the wavenumbers for the carrier wavefunctions that exponentially decay, within the barrier, from the left and right interfaces, respectively. These wavenumbers are given by:

$k=\sqrt{2m_l(V-E_l)/\hbar^2}$, $q=\sqrt{2m_r(V-E_r)/\hbar^2}$.

Figure 12:
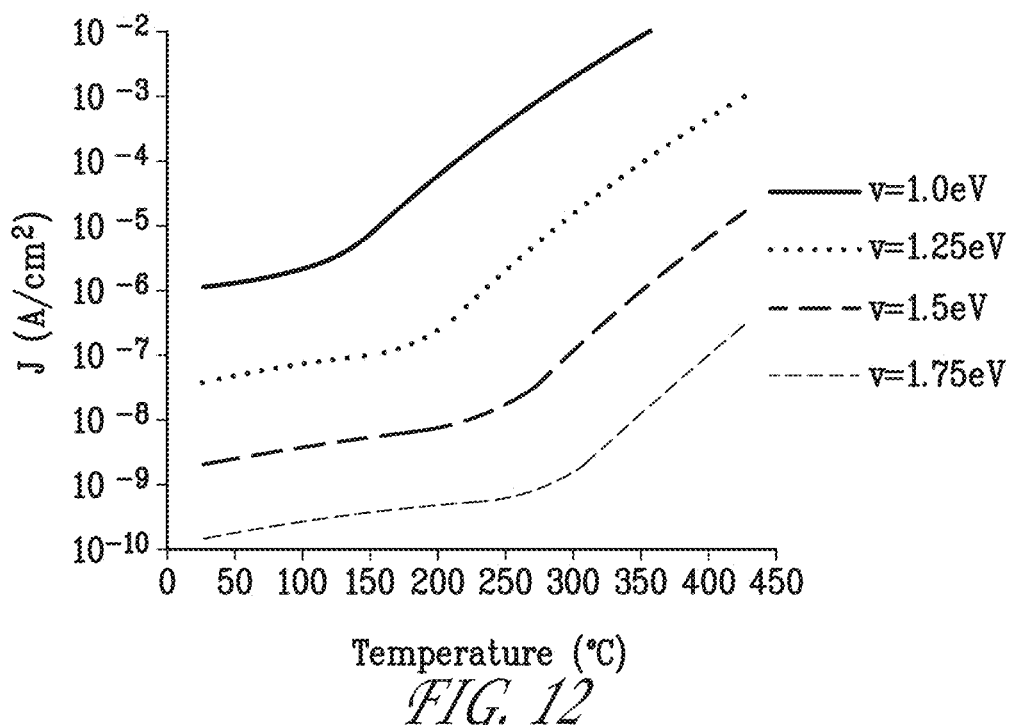
FIGS. 12 and 13 are graphs of the theoretical tunneling current density versus temperature for a simple model of a rectifying tunnel junction device.
Figure 13:
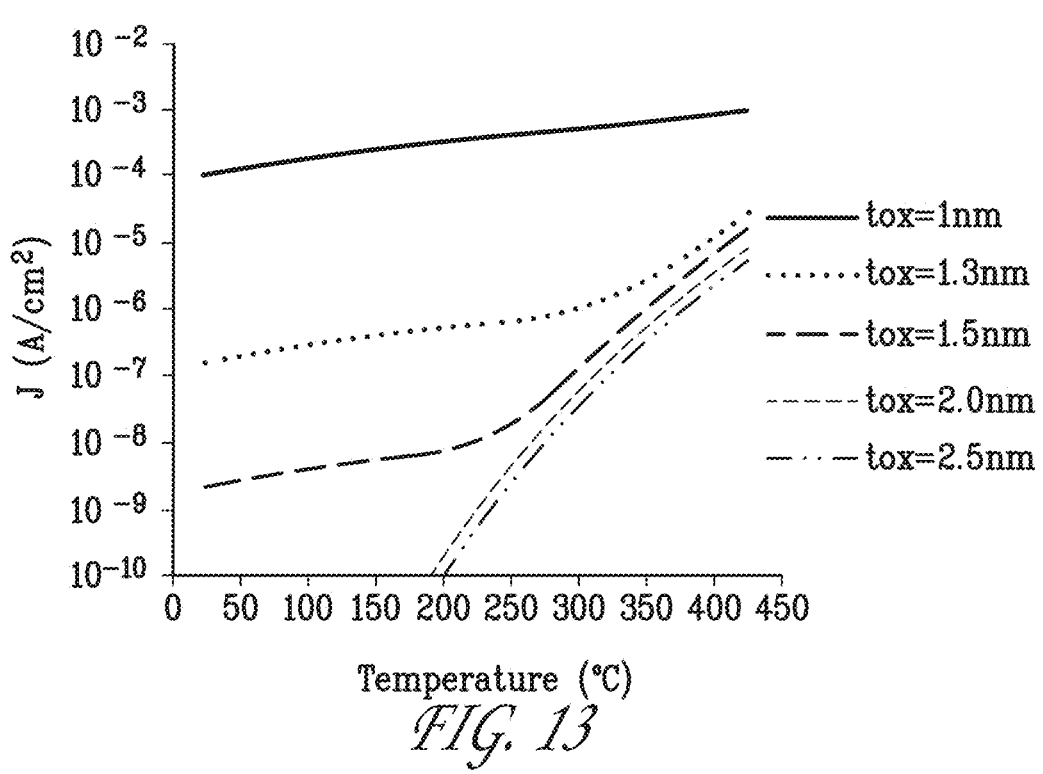

As reported in Davids (2018), we computed the tunneling current density for barrier heights from 1.0 eV to 1.75 eV in increments of 0.25 eV at a constant barrier thickness of 1.5 nm, and we computed the tunneling current for barrier thicknesses of 1 nm, 1.3 nm, 1.5 nm, 2.0 nm, and 2.5 nm at a constant barrier height of 1.5 eV. We assumed that both the left-hand-side and right-hand-side electron effective masses were 0.19 times the fundamental electronic mass me, and that the effective mass within the barrier was 0.5 $m_e$. For the computation, the electric field within the barrier was obtained from a blackbody distribution at the specified temperature (i.e., the temperature plotted along the horizontal axis of each of the two graphs below) at a central wavelength of 7.3 μm ($\hbar\omega$=0.17 eV) and a bandwidth of 1 THz. The results of the computation are provided in FIGS. 12 and 13.

Returning to the structure of a practical device, we again note that one of the features of the present invention is that an $n^+$ region and a $p^+$ region of semiconductor material underlies each of the grating elements. In example processes for fabrication, the n-type and p-type dopants are deposited in thin stripes by ion implantation, and then diffused outward from the implanted stripes under heat treatment. In other example processes, a blanket implant of n-type dopant ions is followed by a spatially selective implant of p-type dopant ions in sufficient concentration to overcompensate the background n-type population in the regions the are intended for the $p^+$ regions.

In either case, it is possible for a p-n junction to form between the outer edges of the p+ regions and the outer edges of neighboring $n^+$ regions. Such a junction does not contribute to the desired performance of the rectenna, and in fact it can detract from the performance by providing a leakage path for current. In some embodiments, however, the p-n junction is expected to have a high enough junction resistance to be tolerable for at least some applications.

Alternatively, isolation trenches can be formed to provide at least partial isolation between the $p^+$ regions and the $n^+$ regions. In some implementations, isolation is provided between the $n^+$ and $p^+$ regions by an intervening intrinsic region. If large enough, such a region might offer enough diode resistance to shunt the photocurrent to the load resistance. In other implementations, the p-type and n-type regions are wholly or partially isolated from each other by isolation trenches. The isolation trenches are filled with a dielectric material such as silicon nitride. Our current belief is that trench isolation will offer better electrical characteristics.

Typically, a pair of electrical contacts will be provided: One to the $p^+$ region and one to the $n^+$ region, so that the rectified photocurrent can be passed through an external load connected between these contacts. More generally, each unit cell of the rectenna can be provided with such a pair of contacts, and the contacts can be connected in a parallel network, a series network, or a network that combines parallel and series connections to achieve desired output characteristics.

According to our current belief, the rectenna can be operated as a two-terminal device; that is, useful power output can be obtained simply by connecting the load to the contacts of the kind described above. Accordingly, we believe that the metal grating elements can be permitted to float in electrical isolation from each other. We believe further that the bulk substrate can likewise be disconnected from a voltage reference.

However, it may be desirable for at least some purposes to connect the metal grating elements to a voltage reference, for example to ground potential. Such a connection is facilitated by a grating pattern that includes bus bars or a web of interconnecting arms that form a continuous electrical connection to all of the metal grating elements. It may likewise be desirable for at least some purposes to connect the body of the device, i.e. the bulk substrate, to a voltage reference. Hence, the device may be operated as a three-terminal device, or even as a four-terminal device.

Notably, when the rectenna is operated as a two-terminal device, both terminals can be situated on the front face of the device, i.e., on the same side as the metal grating elements. Similarly, when the rectenna is operated as a three-terminal device with a voltage reference connected to the grating elements, all three terminals can likewise be situated on the front face.

Figure 14:
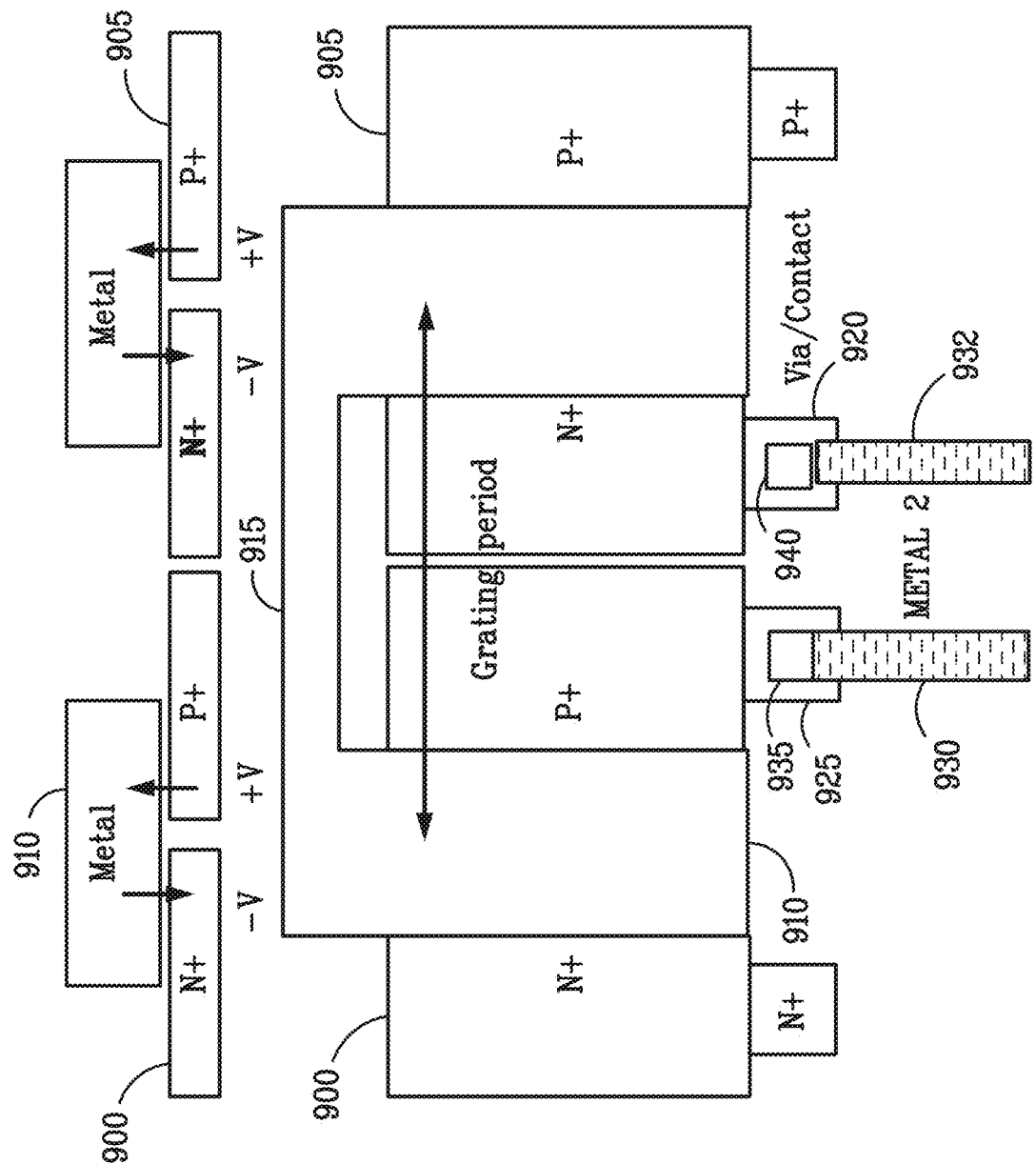
FIG. 14 schematically illustrates two unit cells of an example rectenna according to the present invention, designed with a one-dimensional grating. The upper portion of the figure is an elevational cross-section of the surface portion of the device. The lower portion of the figure is a plan view of the same device.

FIG. 14 schematically illustrates two unit cells of an example rectenna with a one-dimensional grating. The upper portion of the figure is an elevational cross-section of the surface portion of the device, showing only the $n^+$ regions 900 and $p^+$ regions 905 and the metal grating elements 910. The lower portion of the figure is a plan view, showing the same features as above, as well as a bus bar 915 between two metal grating elements, heavily doped contact regions 920, 925 for the $n^+$ and $p^+$ regions respectively, metal conductor 930, 932, and vias 935, 940 that connect the metal conductor downward through an encapsulation layer to contact regions such as regions 920 and 925.

Arrows superimposed on the upper portion of the figure indicate the particle current of photoelectrons. As shown, the current passes from p-type semiconductor 905 into the metal grating element 910, and from the metal grating element 910 into n-type semiconductor 900. From the n-type semiconductor, the current flows through a load (not shown), and back into the p-type semiconductor.

Figure 15:
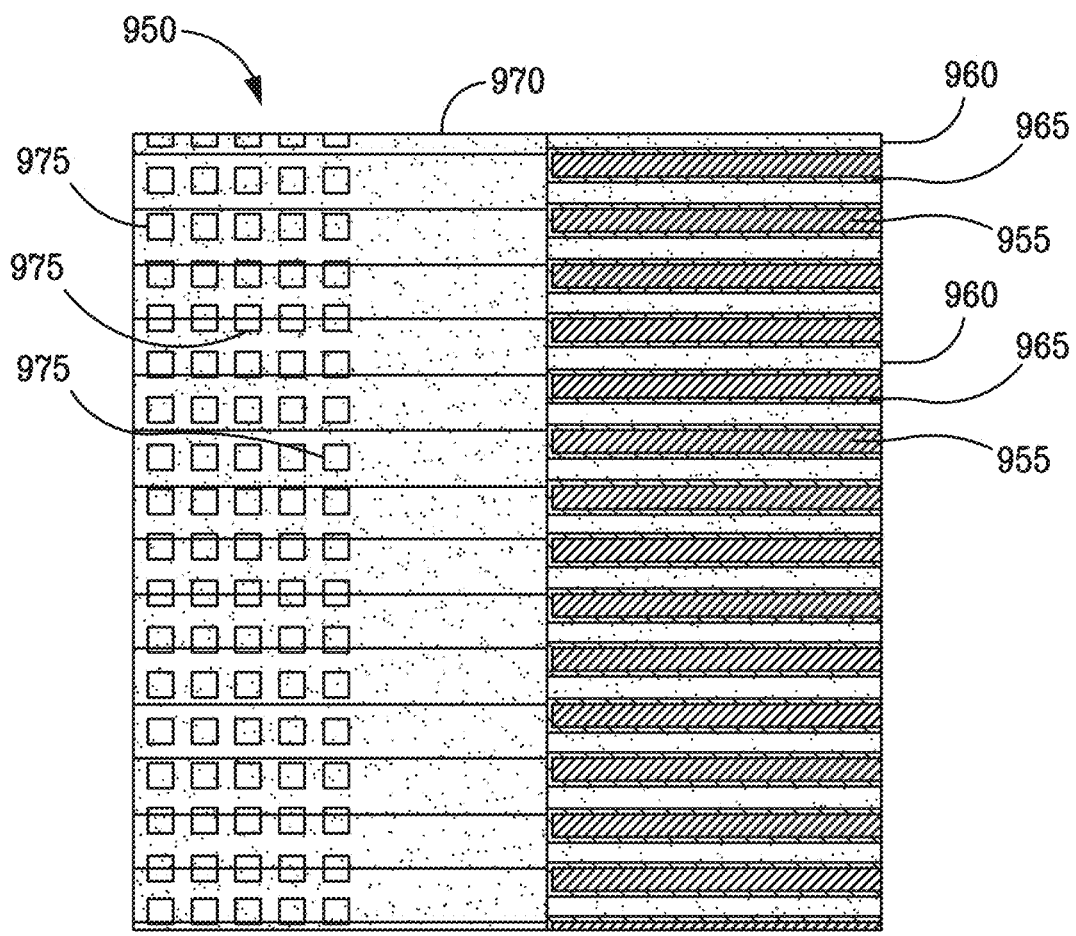
FIG. 15 is a view of a portion of a doped substrate for a rectenna according to the present invention, but without the grating elements. The figure provides an example of trench isolation.

FIG. 15 is a view of a portion of a doped substrate 950 without the grating elements. The figure provides an example of trench isolation between $p^+$ strips 955 and $n^+$ strips 960. The isolation is provided by meandering trench 965, which constitutes an isolation trench between each pair of neighboring highly doped strips. In example implementations, trench 965 is etched through the 2.5 thick silicon device layer of an SOI wafer.

In the view of FIG. 15, only the end of substrate 950 having an $n^+$ contact region 970 is shown. At an opposing end of the substrate, which is not shown in the figure, there is a corresponding $p^+$ contact region. Each of the small squares 975 in the figure represents a metal contact to the $n^+$ contact region.

Figure 16:
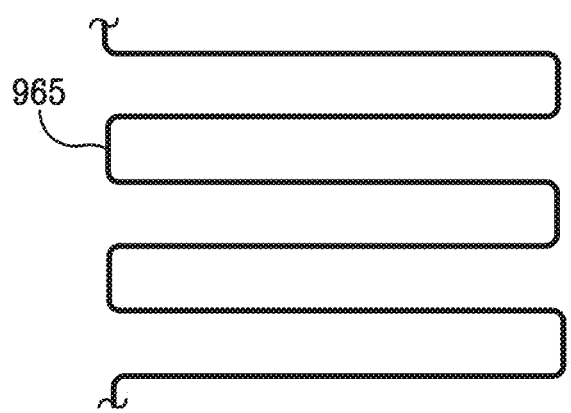
FIG. 16 is a notional representation of a meandering trench useful for trench isolation in an arrangement such as that illustrated in the preceding figure.

The meandering shape of trench 965 is not directly evident from FIG. 15, because only a portion of the substrate is shown. The meandering shape is more clearly shown in the notional view of FIG. 16, where elements that are common to both figures are called out by like reference numerals. It will be evident from FIG. 16 that the $n^+$ and $p^+$ portions of the substrate are interdigitated in the embodiment that is shown.

Figure 17:
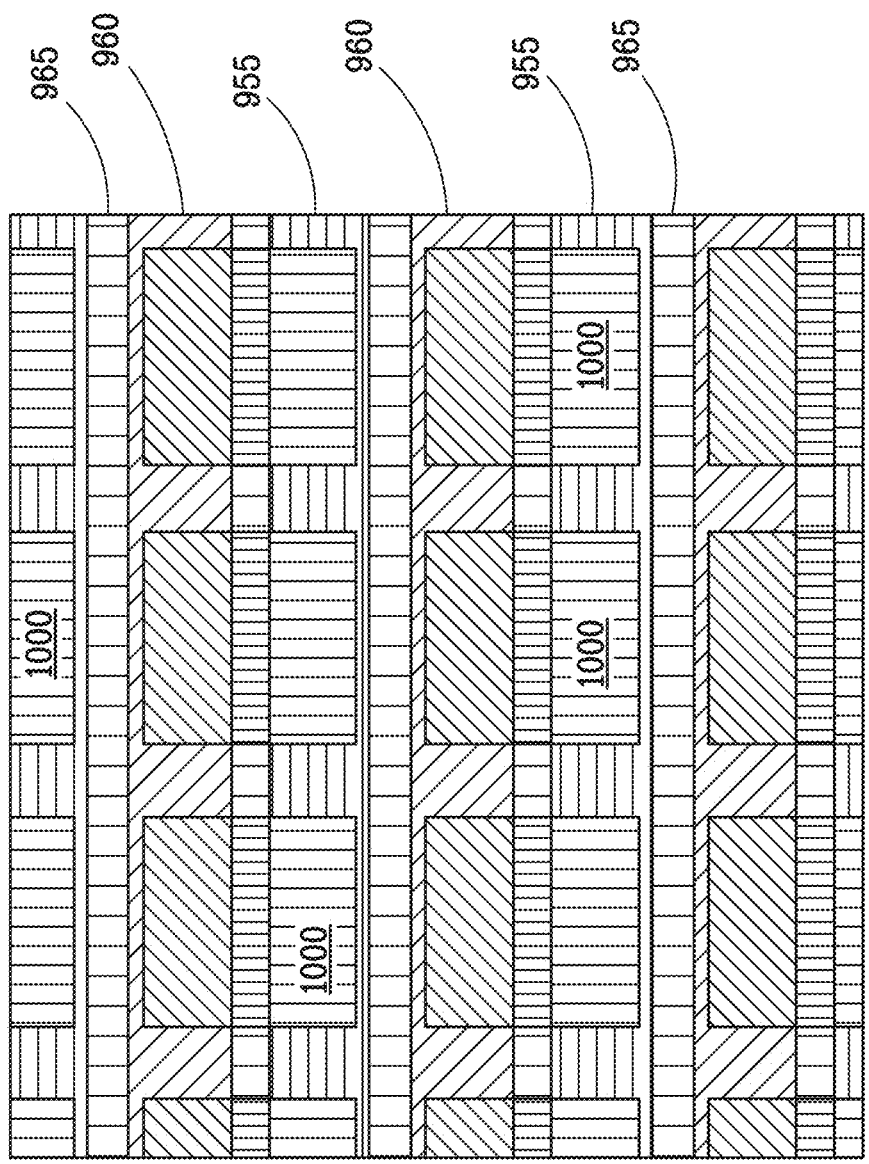
FIG. 17 is a schematic plan view of a portion of a rectenna including a 2D array of metal patch antennas.

FIG. 17 is a schematic plan view of a portion of a rectenna including a 2D array of metal patch antennas 1000. As in FIG. 15, p+ strips, n+ strips, and isolation trenches are shown. Elements that FIG. 17 has in common with FIG. 15 are called out by like reference numerals. As seen in the figure, each patch antenna overlies one pair of $p^+$ and $n^+$ strips and the isolation trench between them.

Figure 18:
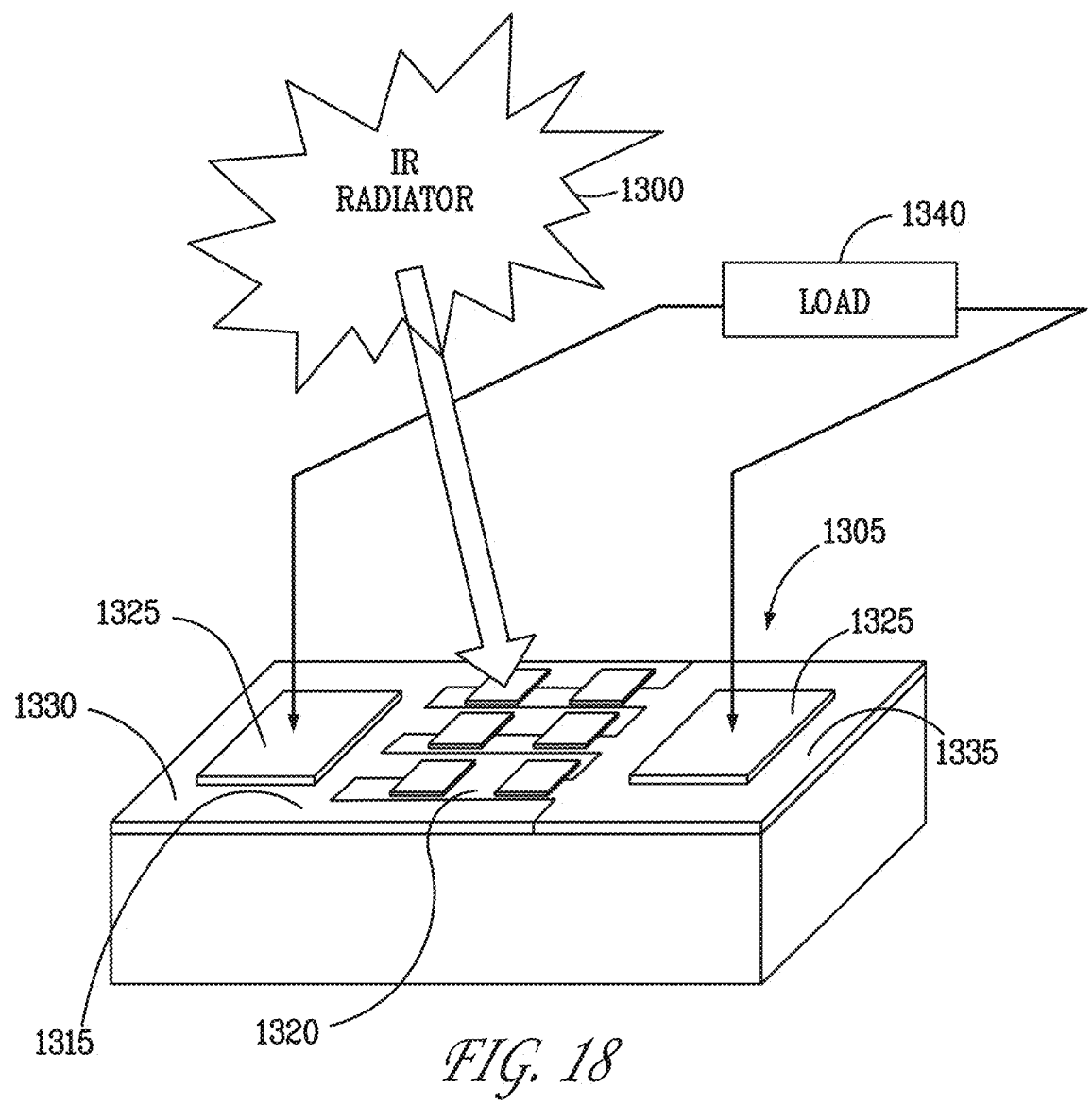
FIG. 18 is a highly simplified notional drawing of a rectenna of the kind described here, in use for converting infrared radiation to electricity.

FIG. 18 is a notional perspective view of a full-wave rectenna in use. As seen in the figure, an incandescent source or other infrared radiator 1300 emits radiation, some of which impinges on rectenna 1305. The rectenna includes metal patch antennas 1310 overlying interdigitated n+ strips 1315 and p+ strips 1320. Metal contacts 1325 are shown deposited on n+ contact region 1330 and p+ contact region 1335. A load 1340 is connected between the metal contacts.

In example implementations of the rectenna described here, a heavily doped surface layer of a silicon or SOI substrate is overlain by a high-quality oxide gate layer, 3-5 nm in thickness. This is followed by a periodic grating of aluminum-copper alloy (AlCu) that is deposited together with front-side bond pads.

In example devices, the tunnel barrier is thermally grown oxide 4 nm thick, the grating period is 3 µm, and the width of the grating elements is 1.5 µm.

The entire assembly is encapsulated by an overlayer of glass, typically borophosphosilicate glass. An example range for the glass thickness is 100-1000 nm, and a typical thickness is 200 nm. Metal contacts reach down to the bond pads through openings cut in the encapsulating glass layer.

We will now describe examples of two alternative processes that we have used for fabricating rectenna devices. We refer to these processes as the "resistive isolation method" and the "trench isolation method". In both processes, the heavily n-type and p-type regions are defined by DUV lithography and doped by ion implantation. The dopant ions are implanted in thin stripes that are subsequently spread by diffusion during heat treatment.

Further information about our fabrication processes can be found in the article, Paul S. Davids et al., "Infrared rectification in a nanoantenna-coupled metal-oxide-semiconductor tunnel diode," *Nature Nanotechnology Letters* 10 (December 2015) 1033-1038, with its Supplementary Information, which is available online as DOI:10.1038/NNANO.2015.216. The article, including its Supplementary Information, is hereby incorporated herein by reference in entirety.

In the resistive isolation method, these regions are isolated from each other solely by the junction resistance between them. If the shorting path between the n-type and p-type regions is of concern, the wafer can optionally be thinned by subtractive processing from the backside to make the shorting path narrower. The thinned wafer can be bonded to a package, such as a DIP package, for mechanical support.

In the trench isolation method, isolation trenches are created first, and then the p+ and n+ regions are defined and doped on respective sides of the isolation trenches. The trenches constitute a physical diffusion barrier that prevents the n-type and p-type regions from interpenetrating during the thermal cycles for activation and oxide growth.

Example implementation of the resistive isolation method. Infrared rectenna devices were fabricated on a 2-µm lightly doped n-type silicon film grown epitaxially over an n+ doped silicon substrate. (For the present discussion, the lightly doped silicon film is considered to be part of the substrate, and it is considered to be the substrate portion that forms semiconductor junctions with the n+ doped and p+ doped regions discussed above.)

A thermal screen oxide was grown. Areas were defined as N and P using DUV lithography, and the regions were doped respectively n+ and p+ using ion implantation of phosphorus and boron, respectively, to $1 \times 10^{20}$ atoms/cm$^3$. The dopants were activated, and implant damage was reduced using a rapid thermal anneal (RTA).

The screen oxide was stripped to reveal a bare silicon surface. A tunnel oxide of 3.5 nm thickness was grown in a dry oxygen-nitrogen ambient at 800° C. The dopants were then diffused in nitrogen at 1050° C. for 60 minutes, which resulted in driving the dopants outward, parallel to the substrate surface, so that the boundaries of the respective N and P regions spread into close proximity.

AlCu (aluminum with 1% copper) was deposited to a thickness of 0.7 µm and patterned using lithography and an aluminum dry etch tool using BCL3/Cl2/N2 chemistry. The dry etch created grating areas and bond pads. The dry etch also cut through the exposed AlCu film areas and continued below them to trench into the oxide and silicon surface to a fixed target overetch depth of 200 nm.

Spin-on glass was deposited over the AlCu and planarized by chemical-mechanical polish (CMP) to a target mean thickness of 200 nm over the metal.

Contacts to the N and P doped regions were formed in a trench process. Titanium was deposited on the silicon surface and annealed for conversion to titanium silicide. The trenches were then backfilled with tungsten to form vias, which were polished flat by CMP.

The glass over the grating regions was thinned to minimize reflection of infrared light, and the glass was etched to expose the bond pads.

In an alternative approach, the thermal screen oxide was omitted. Instead, the dopant ions were implanted through the tunnel oxide. It is significant in this regard that the ion implantation and subsequent heat treatment can affect the growth rate of a post-implant thermal oxide layer for the tunnel barrier. A possible consequence is that the tunnel barrier could grow with a non-uniform thickness. The alternative approach of implanting through the tunnel oxide can avoid this problem. Another way to avoid the problem is to grow the tunnel oxide by atomic layer deposition (ALD) instead of by thermal oxidation.

Example implementation of the trench isolation method. In this implementation, the rectenna devices were fabricated on silicon wafers. The wafer was doped n-type, by ion implantation, to a dopant concentration of $1 \times 10^{18}$ atoms/cm$^3$ at depths beginning 3 µm below the surface of the wafer. The dopant was then activated using an RTA process. The implant was performed through a screen oxide that was removed after the thermal activation. The purpose of this doping was to make the silicon highly reflective in the infrared spectrum.

Borophosphosilicate glass (BPSG) was then deposited utilizing a PECVD reactor. The glass was patterned using DUV lithography and dry etched. The etch chemistry was then changed, and trenches were formed in a second etching step. To form the trenches, we etched 2.5 µm through the active layer of the SOI wafer, landing on the buried oxide.

The BPSG was stripped in hot phosphoric acid, which was chosen in part because it would minimize any sideways etch of the buried oxide. The corners of the trenches were rounded using a thermal oxidation/etch/oxidation process.

The trench formation process that we chose uses multi-layered oxides to reduce undercutting of the buried oxide (BOX) layer of the SOI wafer. One effect of this process is to produce a thin protective layer of silicon oxide on the silicon device layer, including the silicon surface between the trenches. This thin oxide layer subsequently serves as an etch stop for a silicon nitride etch, as will be seen below.

Silicon nitride (SiN) was deposited on the entire surface to a thickness sufficient to fill the trenches. The SiN was then planarized by CMP and dry etched back to the thin protective oxide on the silicon surface between the filled trenches.

Areas were defined as N and P using DUV lithography, and the regions were doped respectively n-type and p-type using ion implantation to 1×10²⁰ atoms/cm³. The dopants were activated, and implant damage was reduced, using an RTA process.

The thin protective oxide was stripped to reveal a bare silicon surface. A tunnel oxide of 3.5 nm thickness was grown thermally in a dry oxygen-nitrogen ambient at 800° C. (As noted above, growing the tunnel oxide by ALD can avoid possible non-uniformities in the oxide thickness.) The dopants were diffused in nitrogen at 1050° C. for 60 minutes, which had the result of driving the dopants to the edges of the trenches. AlCu was deposited to a thickness of 0.7 µm and patterned using lithography and a dry etch created the grating areas and bond pads and the overetch into the silicon as described above. Glass was deposited over the AlCu and planarized.

Contacts were formed to the N and P regions. The glass over the grating regions was thinned via dry etch to minimize infrared reflections, and the glass was etched to expose the bond pads.

Example 1

Figure 19:
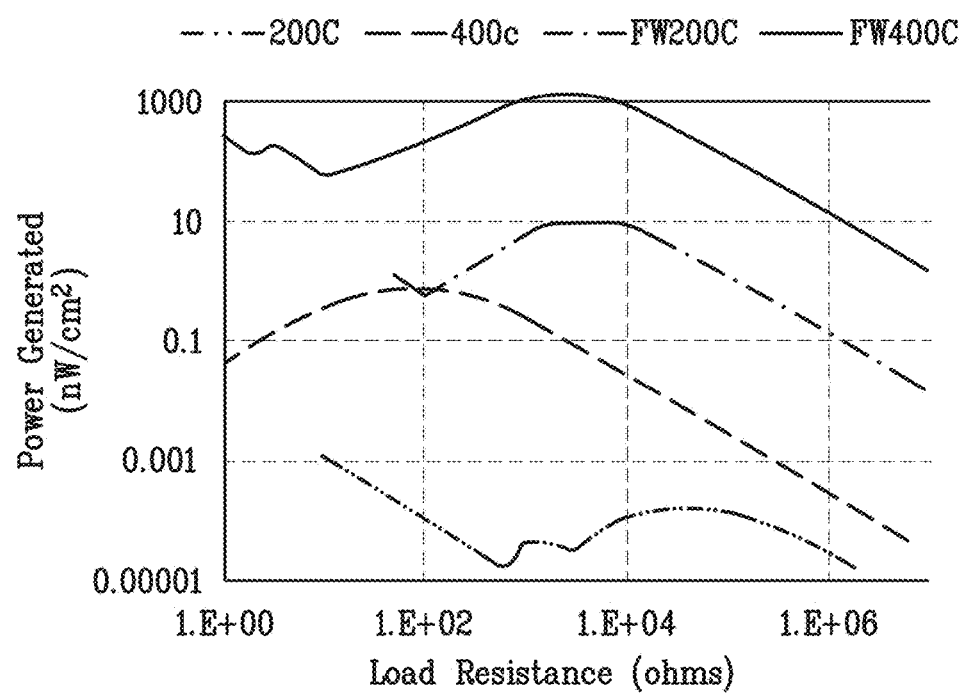
FIG. 19 is a graph of generated electric power versus load resistance for example half-wave and full-wave rectennas when driven by thermal radiators at different temperatures.

A prototype full-wave rectenna substantially as described above, without trench isolation, was fabricated and tested. FIG. 19 is a graph of our measurements of electric power that the prototype generated in response to infrared radiation from a thermal radiator at two temperatures: 200° C. and 400° C. The electric power is plotted as a function of the load resistance, which varied from 1Ω, to somewhat greater than 1MΩ. For comparison, measurements taken on a prototype half-wave rectenna are also plotted in the figure.

In sequence from the bottom of the graph, the four plotted curves are: half-wave rectenna at 200° C., half-wave rectenna at 400° C., full-wave rectenna at 200° C., and full-wave rectenna at 400° C.

The grating for the full-wave prototype had an optimized period of 3 µm and grating element width of 1.5 µm. The grating for the half-wave prototype had an optimized period of 3 µm and grating element width of 1.8 µm.

Example 2

We fabricated a grating-coupled bipolar tunnel diode device and used it to generate electric power from a moderate-temperature source. Power measurements were made using a vacuum thermophotovoltaic measurement system with a gap of roughly 2 mm between the sample and the heat source.

Figure 20:
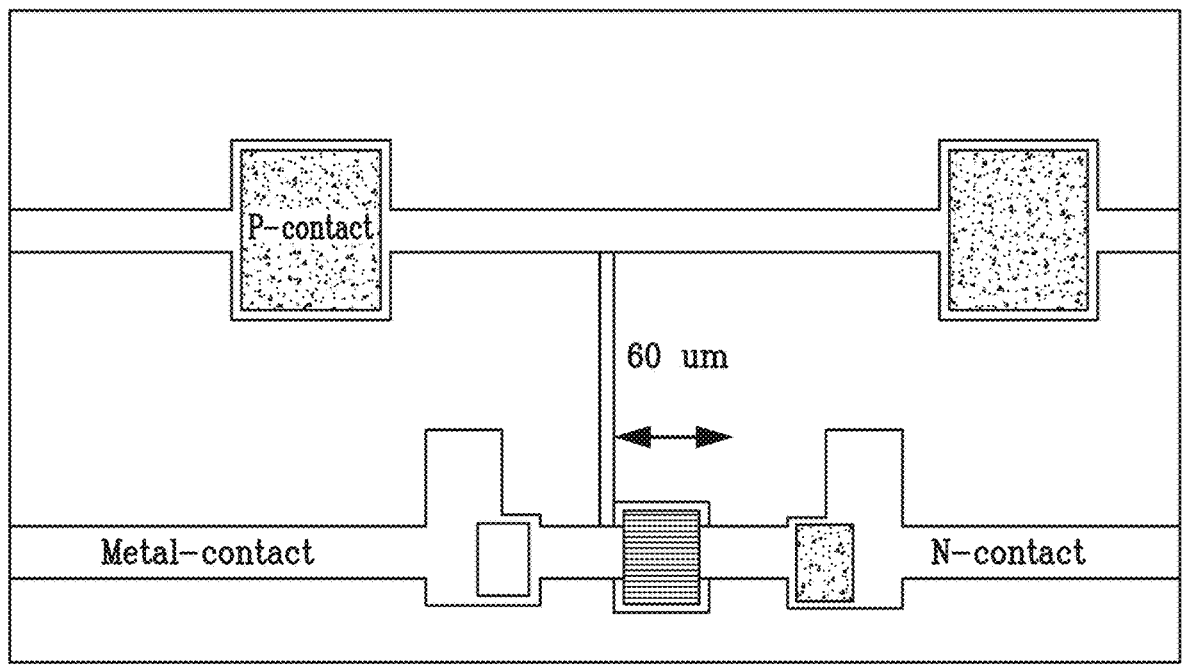
FIG. 20 is a rendering from an optical micrograph of a test device made according to principles described here. As seen in the figure, it is a three-terminal device with contacts to the n-type region, the p-type region, and the metal grating element.

FIG. 20 is a rendering from an optical micrograph of our test device. As seen in the figure, it is a three-terminal device with contacts to the n-type region, the p-type region, and the metal grating element.

Figure 21:
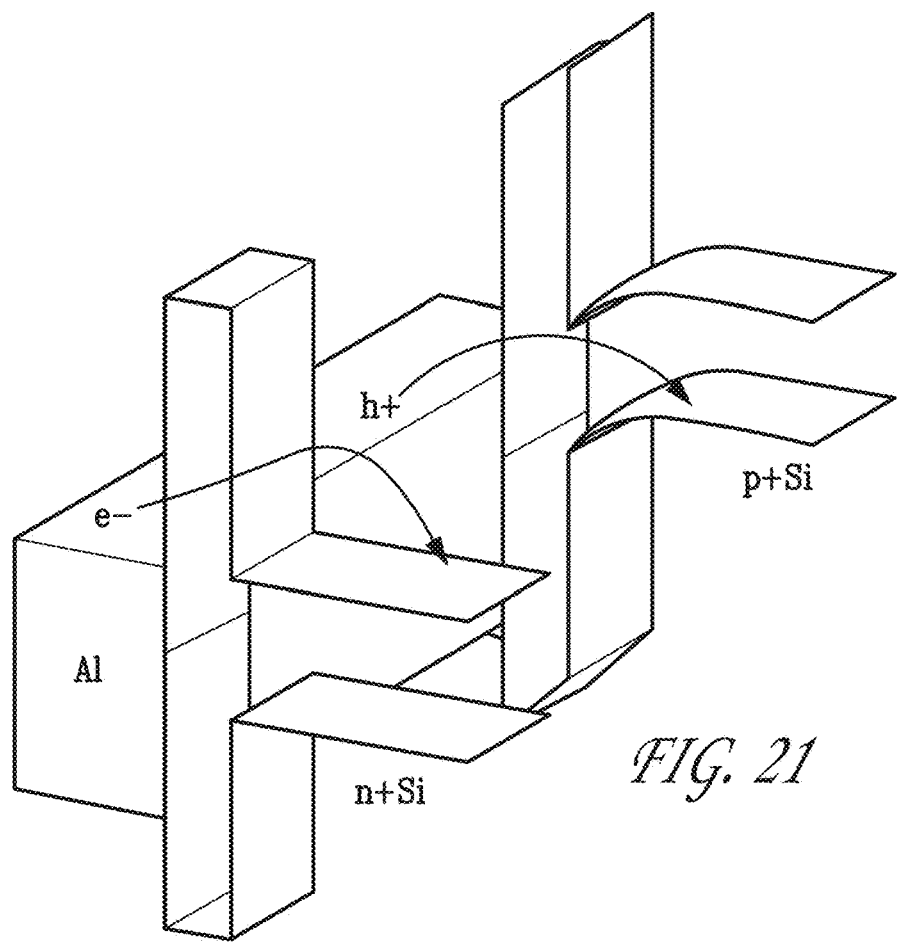
FIG. 21 is a cartoon drawing of a single unit cell of a rectenna device of the kind described here, illustrating band bending and electron and hole particle currents at extremes of the n and p regions.

FIG. 21 is a cartoon drawing of a single unit cell of a rectenna device illustrating band bending and electron and hole particle currents at extremes of the n and p regions.

Figure 22:
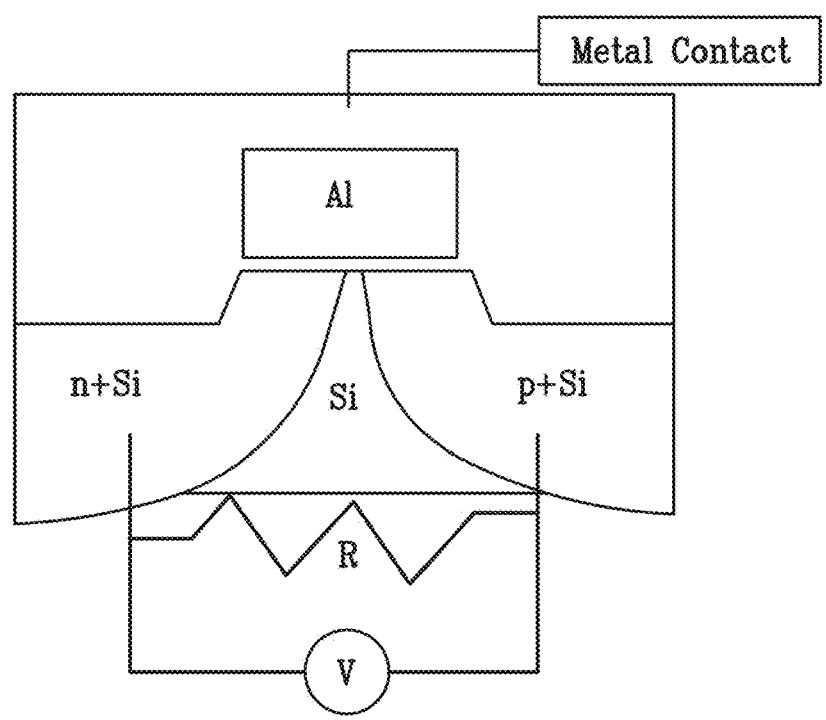
FIG. 22 is a schematic drawing of a contacting scheme for photovoltaic generation of power across a load resistor connected to a rectenna device of the kind described here. As seen in the drawing, the load resistor is connected between the n-type and p-type regions, and a meter is included to measure the voltage across the load.

FIG. 22 is a schematic drawing of a contacting scheme for photovoltaic generation of power across a load resistor. As seen in the drawing, the load resistor R is connected between the n-type and p-type regions, and a meter V is included to measure the voltage across the load.

The active area of our test device is approximately 60 µm×60 µm. The grating has a pitch of 3.0 µm and a metal width of 1.8 µm. As noted above, the device is a three-terminal device. It has interdigitated n and p regions with separate n, p, and metal contacts. There was no trench isolation.

To measure the induced voltage from the thermal source at fixed temperature, we shorted the p-n junctions with a variable load resistor as shown in FIG. 22. We used a nanovoltmeter to measure the induced voltage as a function of the load resistance.

The process and device parameters play a key role in the performance of the bipolar device. We observed that the oxide thickness affected the tunneling resistance and that the oxide composition affected the ENZ field concentration. We also observed that the implant conditions and thermal annealing cycles could have a significant effect on p-n junction characteristics. For example, dopant diffusion under the metal gate could affect the junction resistance and the depletion width.

Figure 23:
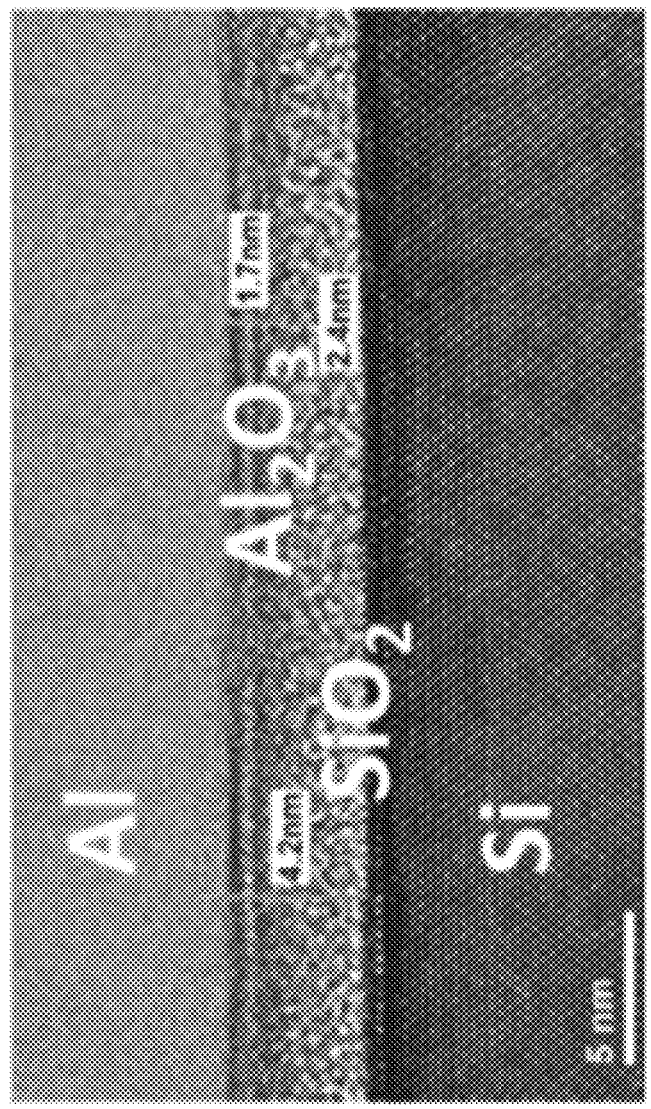
FIG. 23 is a rendering from a transmission electron microscope (TEM) cross-sectional image of an example rectenna device. A portion of the gate metal, the silicon dioxide tunnel layer, and a portion of the underlying silicon substrate are visible in the figure.

FIG. 23 is a rendering from a transmission electron microscope (TEM) cross-sectional image of the device under the gate metal (i.e., under the antenna element). A portion of the gate metal, the silicon dioxide tunnel layer, and a portion of the underlying silicon substrate are visible in the figure. The nominal oxide thickness was targeted at 4 nm and measured at 4.2 nm.

In addition to the layers listed above, there can be seen a thin alumina layer that formed at the $SiO_2$/Al interface. We believe that this alumina layer arises from contact silicide formation during thermal processing. We confirmed its composition by energy dispersive x-ray spectroscopy (EDS).

Figure 24:
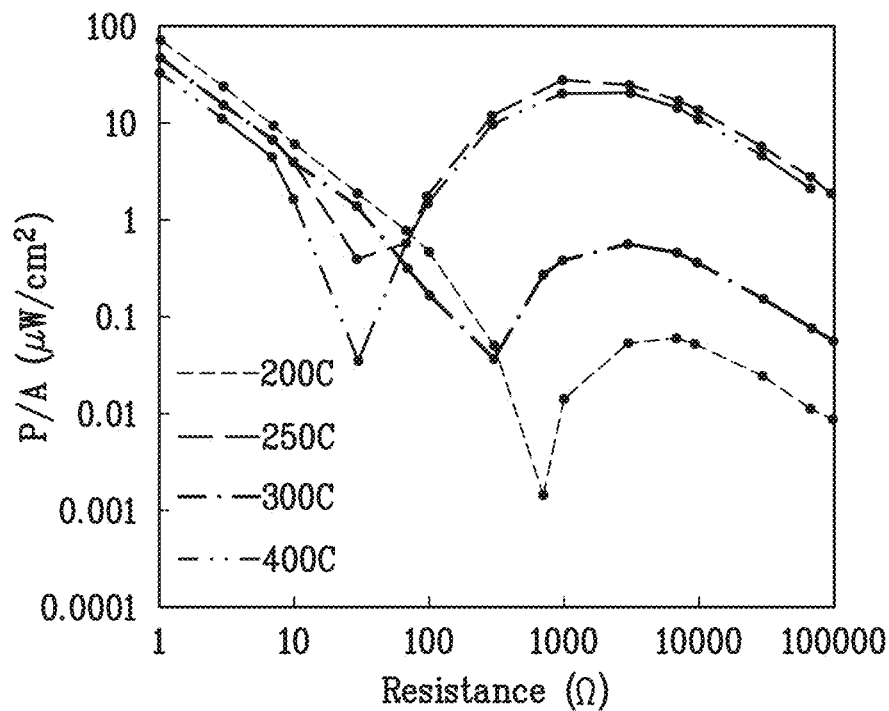
FIG. 24 is a graph of the power density (i.e., the generated electric power per unit area) as a function of load resistance that was measured from a test device at various source temperatures. Curves are shown for source temperatures of 200° C., 250° C., 300° C., and 400° C.
Figure 25:
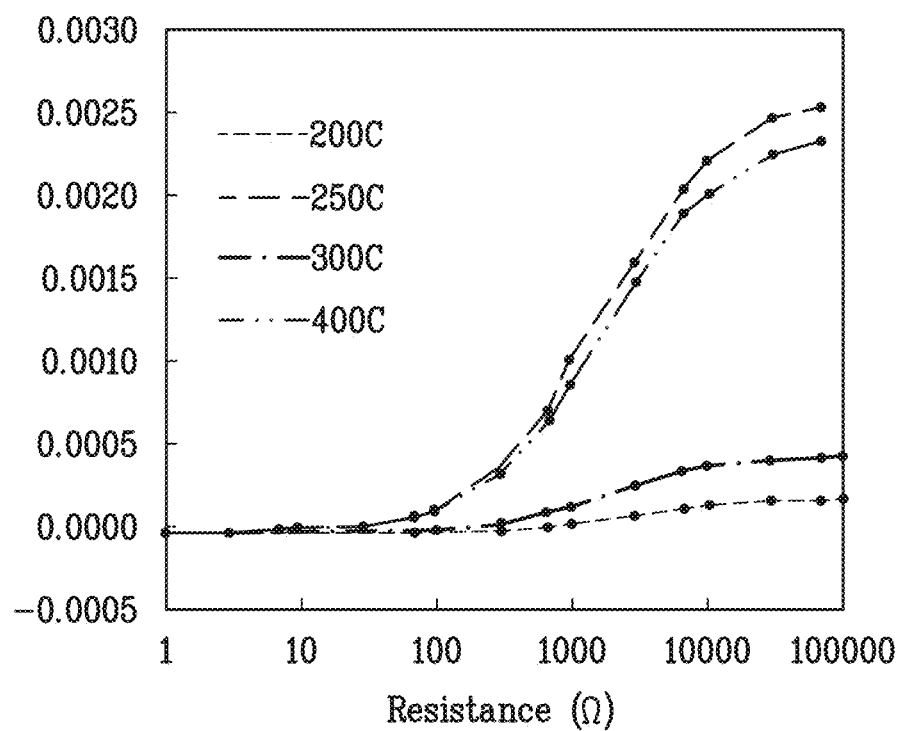
FIG. 25 is a graph of voltage measured on the test device of the preceding figure as a function of load resistance at source temperatures of 200° C., 250° C., 300° C., and 400° C. The metal gate was floating during these measurements.

FIG. 24 is a graph of the power density (i.e., the generated electric power per unit area) as a function of load resistance that we measured from the test device at various source temperatures. Curves are shown for source temperatures of 200° C., 250° C., 300° C., and 400° C. FIG. 25 is a graph of the measured voltage as a function of load resistance at the source temperatures of 200° C., 250° C., 300° C., and 400° C. The metal gate was floating during these measurements.

It will be seen in the figure that a peak power density of approximately 27 µW/cm2 occurs at source temperatures of 250° C. and 400° C. with an open circuit voltage somewhat greater than 2 mV.

It is apparent from the figure that the peak power generation does not increase monotonically with increasing source temperature. As mentioned above, an additional layer of alumina forms in the device during processing. According to our current belief, the drop in peak power generation seen in the figure between 250° C. and 400° C. occurs because the alumina layer tends to shift the peak in the power density to lower source temperatures.

More specifically, the alumina LO phonon resonance occurs at roughly 200° C., i.e. at a wavelength $\lambda_{LO}$ for LO phonon resonance of 10.1 µm. In silicon dioxide, on the other hand, the LO phonon mode occurs at 400° C. or $\lambda_{LO}$=8.1 µm. We therefore believe that a complex interaction between the gate oxide LO phonon resonance and the device design parameters determines the output power. This offers an opportunity to adjust the operational temperature of the device by manipulating the composition and respective material thicknesses within the tunnel layer to tune the LO phonon resonance.

Example 3

We fabricated a device similar to the device of Example 2, above, but with a targeted oxide thickness of 3.5 nm and measured oxide thickness of 3.4 nm.

Figure 26:
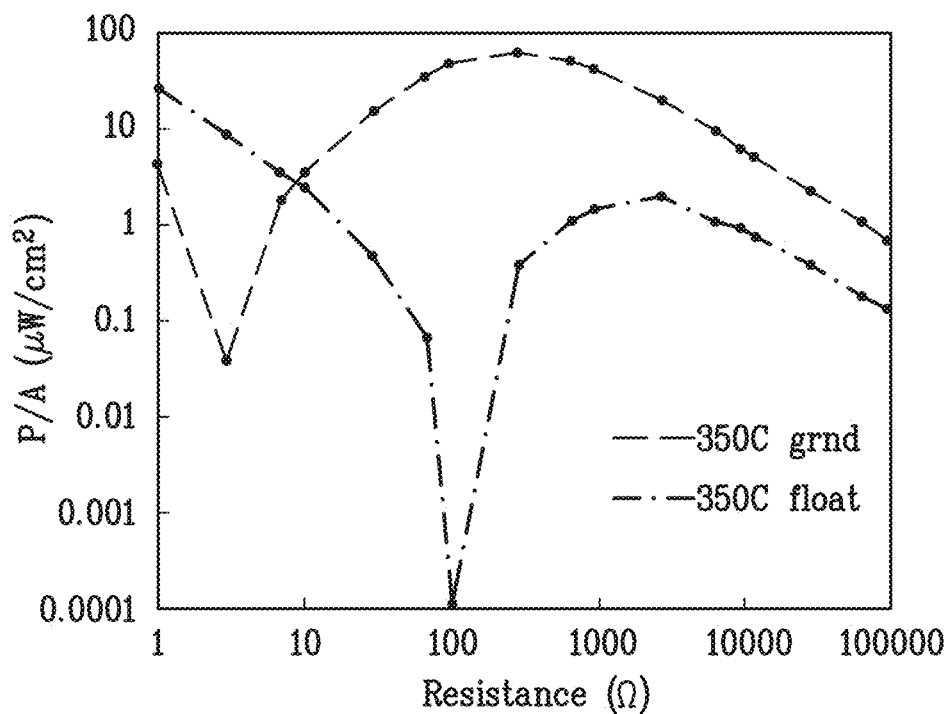
FIG. 26 is a graph of power density as a function of load resistance that was measured from a test device at a source temperature of 350° C. An upper curve is shown for measurements in which the metal gate was grounded, and a lower curve is shown for measurements in which the metal gate was floating.
Figure 27:
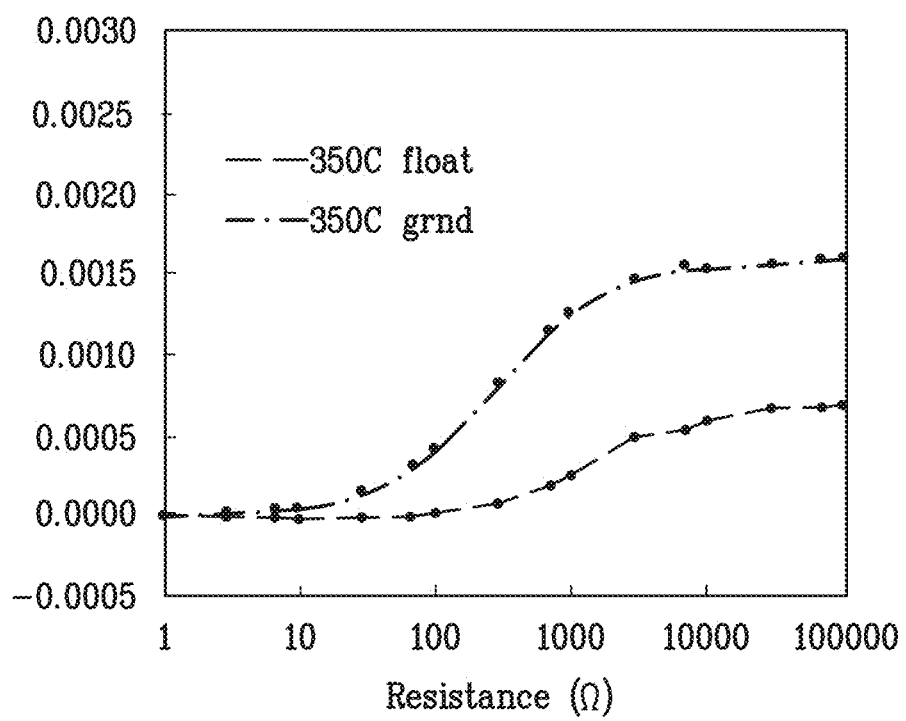
FIG. 27 is a graph of voltage measured on the test device of the preceding figure as a function of load resistance at the same source temperature. An upper curve is shown for measurements in which the metal gate was grounded, and a lower curve is shown for measurements in which the metal gate was floating.

FIG. 26 is a graph of the power density as a function of load resistance that we measured from the resulting test device at a source temperature of 350° C. FIG. 27 is a graph of the measured voltage as a function of load resistance at the same source temperature. Each figure has two curves, an upper curve for measurements in which the metal gate was grounded, and a lower curve for measurements in which the metal gate was floating.

As noted above, the measurements of FIGS. 24 and 25 was made with a floating gate. FIGS. 26 and 27, by contrast, compare floating-gate measurements with grounded-gate measurements. We have noted that grounding the metal gate contact can suppress the accumulation of electric charge on the gate and may also reduce electromagnetic interference during the measurements.

We found that grounding the metal contact could increase the measured power density by a factor of 10. As seen in the figure, we measured a peak power density (with gate grounded) of 61 µW/cm² at a load resistance of approximately 250 g. The peak measured open circuit voltage for the grounded case was 1.6 mV; for the ungrounded case it was 0.5 mV.

We claim:

1. Apparatus comprising:
   a semiconductor body comprising a plurality of alternating regions of $n^+$-doped semiconductor and $p^+$-doped semiconductor embedded in host semiconductor material that is more lightly doped than the alternating regions;
   a metallic grating that overlies the semiconductor body and includes a plurality of grating elements; and
   a tunnel barrier, respective to each grating element, comprising tunnel barrier material, interposed between the grating element and the semiconductor body;
   wherein each of the grating elements overlies a respective bridge pair consisting of a said $n^+$-doped region and a neighboring said $p^+$-doped region;
   wherein for each overlying grating element, its respective tunnel barrier, and the respective bridge pair that it overlies, each of the two regions that compose the respective bridge pair forms a rectifying tunnel junction through the respective tunnel barrier to the overlying grating element;
   wherein for each overlying grating element, its respective tunnel barrier, and the respective bridge pair that it overlies, the said p+-doped and n+-doped regions respectively form, with the host semiconductor material, a $p^+$-host junction and an $n^+$-host junction that are electrically connected to each other through the host material such that the respective rectifying tunnel junctions formed through the respective tunnel barrier by the two regions that compose the respective bridge pair, the $p^+$-host junction, and the $n^+$-host junction collectively define a full-wave rectifying bridge; and
   wherein the apparatus further comprises terminals for a load current to pass between the said $p^+$ region and the said $n^+$ region of each bridge pair.

2. The apparatus of claim 1, wherein the semiconductor body comprises a bulk silicon substrate and an epitaxial silicon layer grown on the bulk silicon substrate.

3. The apparatus of claim 1, wherein each grating element is an elongated metal bar that overlies a respective bridge pair.

4. The apparatus of claim 1, wherein each grating element is a discrete patch antenna included in a linear array of discrete patch antennas that overlies a respective bridge pair.

5. The apparatus of claim 1, wherein an isolation trench separates each said $n^+$-doped region from its neighboring $p^+$-doped region or regions.

6. The apparatus of claim 1, wherein the semiconductor body is composed substantially of silicon and the tunnel barrier material is composed essentially of silicon dioxide.

7. The apparatus of claim 1, wherein overetches are interposed between the grating elements, wherein each overetch is defined by an absence of tunnel barrier material and a thinning of the semiconductor body, and wherein a reflective diffraction grating is defined by the grating elements and the overetches.

8. The apparatus of claim 7, wherein the reflective diffraction grating is conformed with a reflective diffraction minimum that falls within the spectral range from 5 µm to 20 µm.

9. The apparatus of claim 7, wherein the reflective diffraction grating is conformed with a reflective diffraction minimum at a wavelength that substantially coincides with an epsilon-near-zero (ENZ) point of the tunnel barrier material.

10. The apparatus of claim 1, wherein the $n^+$-doped regions are connected to a common N terminal and the $p^+$-doped regions are connected to a common P terminal.

11. The apparatus of claim 10, wherein a load is connected between the common N terminal and the common P terminal.

* * * * *